United States Patent [19]
Yi

[11] Patent Number: 5,807,221
[45] Date of Patent: Sep. 15, 1998

[54] SUCTION NOZZLE AUTOMATIC CHANGING APPARATUS

[75] Inventor: Yun-Hyung Yi, Kyungki-Do, Rep. of Korea

[73] Assignee: LG Industrial Systems Co., Ltd., Seoul, Rep. of Korea

[21] Appl. No.: 762,246

[22] Filed: Dec. 9, 1996

[30] Foreign Application Priority Data

Dec. 11, 1995 [KR] Rep. of Korea ............... 1995 48254
Aug. 31, 1996 [KR] Rep. of Korea ............... 1996 37495

[51] Int. Cl.$^6$ ................................................. B23Q 3/155
[52] U.S. Cl. ............................. 483/27; 211/69; 483/55; 483/59
[58] Field of Search ................................ 483/54, 55, 56, 483/57, 58, 59, 16, 27; 211/69, 1.51, 1.57; 29/740, 743

[56] References Cited

FOREIGN PATENT DOCUMENTS 90-067799  3/1997  Japan .

*Primary Examiner*—William R. Briggs
*Attorney, Agent, or Firm*—Oliff & Berridge, PLC

[57] ABSTRACT

An improved suction nozzle automatic changing apparatus for a surface mounting apparatus which is capable of simplifying the construction of the system and enhancing the reliability thereof. The apparatus includes a first pneumatic cylinder having an upper position sensor for detecting a predetermined movement, an upwardly and downwardly movable station connected to a rod of the first pneumatic cylinder, a second pneumatic cylinder having an opening/closing sensor and a clamp sensor and engaged to one side of the station, a clamp having a guide groove and an engaging portion formed on the upper surface thereof, one side of which is connected to the rod of the second pneumatic cylinder, slidably covering the upper portion of the station, and reciprocating in accordance with the movement of the rod of the second pneumatic cylinder, a position determination member having a vertical nozzle receiving hole formed in the center portion thereof, and a clamp groove formed in an outer circumferential surface thereof, which position determination member is inserted into the guide groove of the clamp and is disposed on the upper surface of the station, a suction nozzle having a nozzle hole formed in the center portion thereof, and a ring engaging portion formed in an outer circumferential surface thereof, and an engaging groove matching with the clamp groove when being inserted into the position determination member.

4 Claims, 32 Drawing Sheets

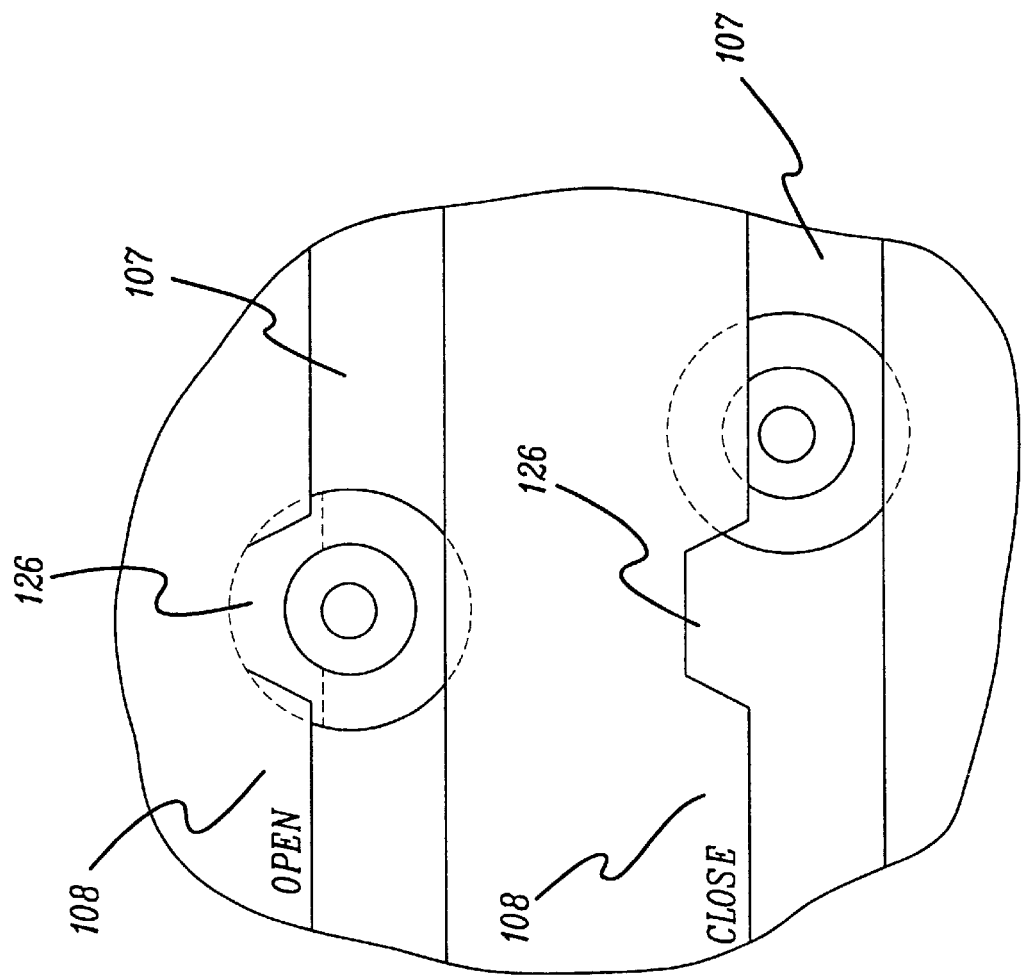
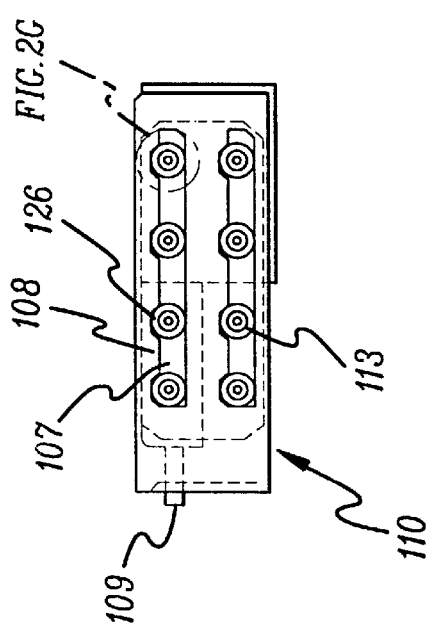

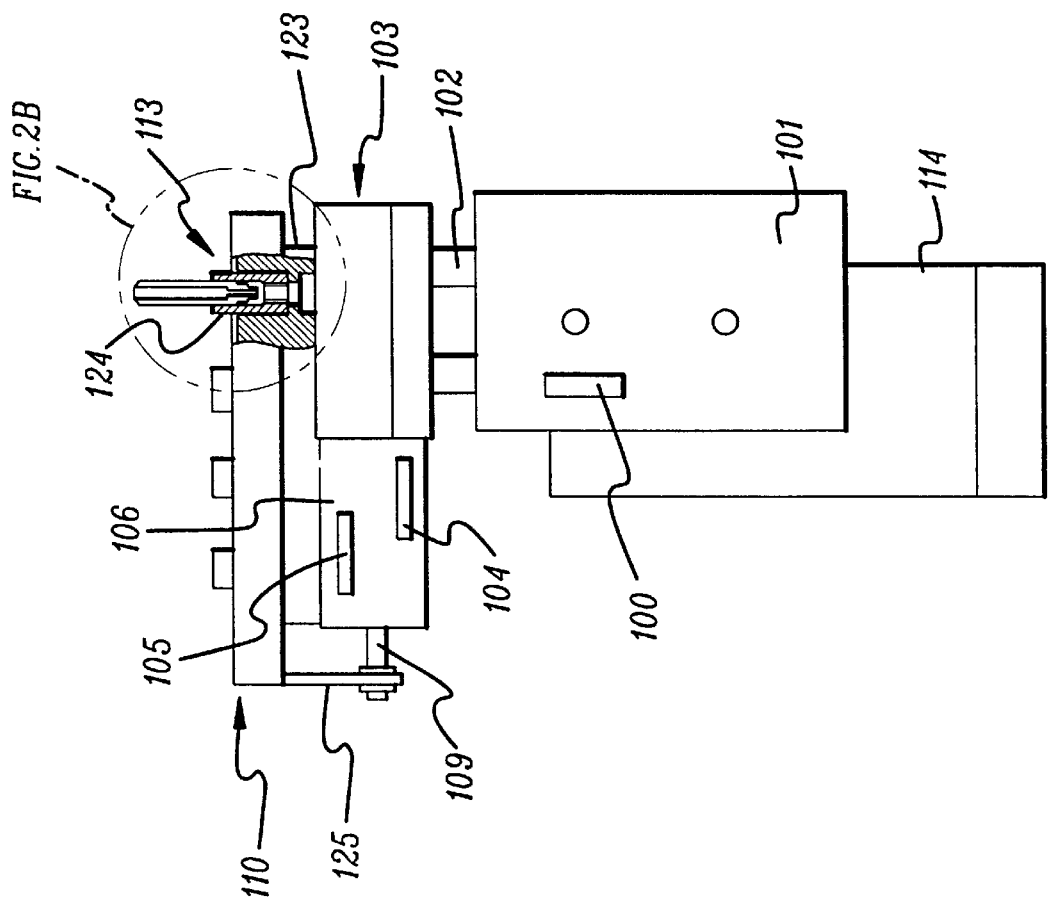
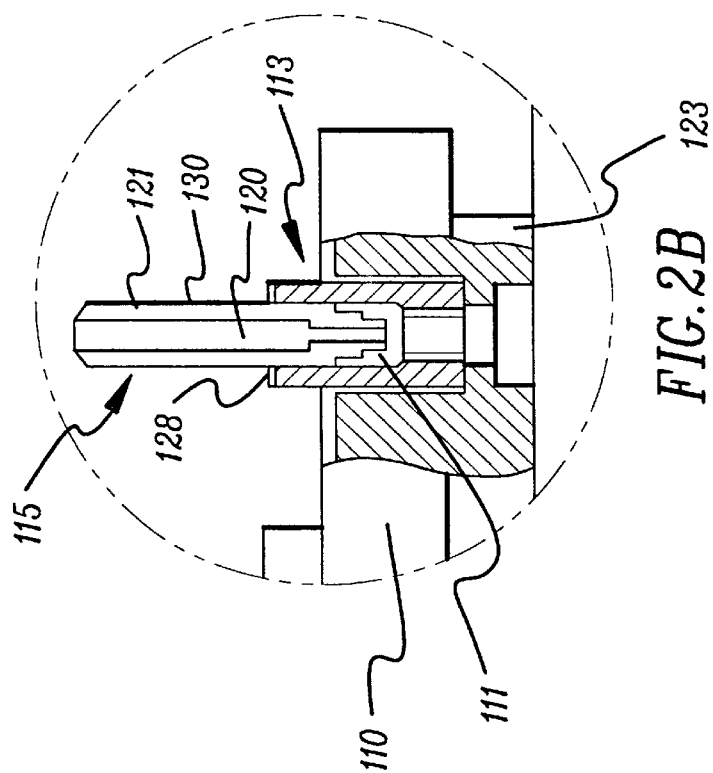

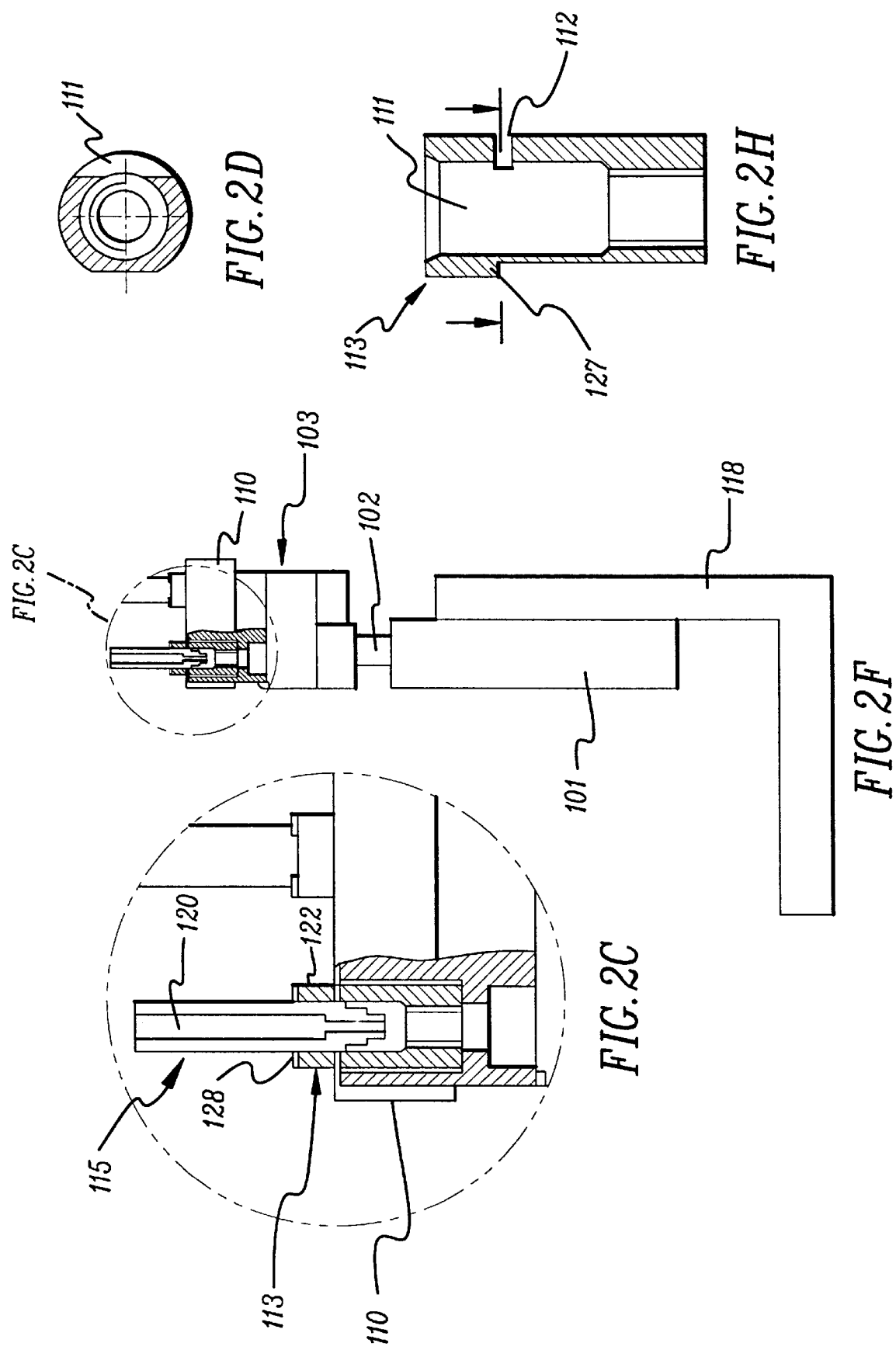

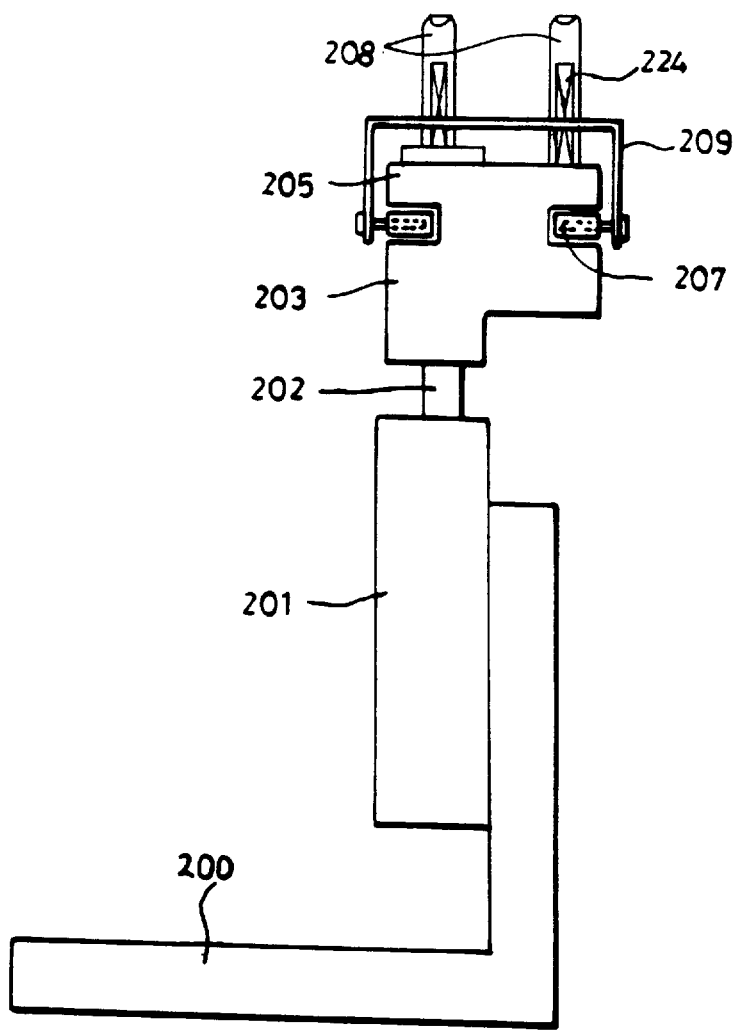

SUCTION NOZZLE AUTOMATIC CHANGING APPARATUS

BACKGROUND OF THE INVENTION

1. Field of the Invention

The present invention relates to a suction nozzle automatic changing apparatus for a surface mounting apparatus, and particularly to an improved suction nozzle automatic changing apparatus for a surface mounting apparatus which is capable of simplifying the construction of the system and enhancing the reliability thereof.

2. Description of the Conventional Art

Generally, the Surface Mounting Technology (SMT) has been increasingly used in the assembling line of the Printed Circuit Board (PCB).

The surface mounting apparatus is an apparatus for mounting the SMD on the PCB, and is an important apparatus for the assembling line of the SMD. In addition, the apparatus is used to mount various surface mounting devices, which are supplied in a from of tape, stick, tray, etc., from a device providing system, transfer the devices to the PCB, and mount the devices on the PCB.

In addition, the surface mounting apparatus is generally classified into a high speed type and a universal type. The high speed type apparatus is capable of assembling many devices very fast, so it is adaptable to the mass production; however, the mounting accuracy is low. Whereas, the universal type apparatus is designed for various shapes of devices. The mounting speed thereof is low, and the mounting accuracy is high, so that it is adaptable to assembling many types (shapes) of devices.

Therefore, the high speed type apparatus is basically designed for a fast assembling of the devices, and the universal type apparatus is basically designed for a more accurate assembling of the devices.

The universal type surface mounting apparatus includes a feeder section for supplying devices, an X-Y table for determining the position of device assembling, a conveyer section for conveying the PCB, and a head section for mounting the devices. Here, the head section is made to have various shapes based on the kinds of devices.

Namely, the head section is classified into a common head type for mounting different devices, and a vision head type for mounting a device, such as a Quad Flat Package, for which it is impossible to perform a mechanical alignment.

The suction nozzle engaged to the head section of the surface mounting apparatus has different inner and outer diameters based on the shape and size of the mounting device in accordance with the stability of a suction of the suction nozzle and the characteristic of the machine used.

FIGS. 1A through 1E are cross-sectional views illustrating a suction nozzle changing apparatus for a conventional surface mounting apparatus disclosed in Japanese Patent Publication 90-067799.

As shown in FIG. 1A, in a state that the head section 2 is positioned just above a suction nozzle receiving apparatus 3, the head section 2 is downwardly moved to a position where the head section 2 can clamp a suction nozzle 1. Thereafter, when a changing section of the suction nozzle receiving apparatus 3 having the suction nozzle 1 is upwardly moved by a pneumatic force, a second spring 10 of the suction nozzle receiving apparatus 3 is compressed, and then the pressure being applied to the second ball 8 in cooperation with the protrusion portion 6 is released, so that the second ball 8 is inserted into a recess 9 of the suction nozzle receiving apparatus 3 as shown in FIG. 1B.

In the above-described state, as shown in FIG. 1C, when the head section 2 downwardly compresses the second spring 10 and a third spring 11 of the suction nozzle receiving apparatus 3, the second ball 8 is further released from the compressed state by the protrusion portion 6, and then is substantially inserted into the recess 9.

Thereafter, when the head section 2 is upwardly moved, since a protrusion portion 5a, as shown in FIG. 1D, presses a first ball 7 by receiving a force from the first spring 5, the first ball 7 can not escape from the recess 5c formed in the outer circumferential surface of the suction nozzle 1. In addition, since the second ball 8 of the suction nozzle receiving apparatus 3 is further outwardly moved by contacting with the outer circumferential surface of the suction nozzle 1 when the suction nozzle 1 is upwardly moved, the suction nozzle 1 is separated from the suction nozzle receiving apparatus 3.

Therefore, the suction nozzle, as shown in FIG. 1E, is separated from the head section 2 from the suction nozzle receiving apparatus 3, for thus changing the suction nozzle 1.

In addition, when engaging the suction nozzle 1 clamped to the head section 2 into the suction nozzle receiving apparatus 3, the operation is performed in the reverse order of the suction nozzle separation process, so that the suction nozzle 1 is clamped into the suction nozzle receiving apparatus 3 from the head section 2.

However, the construction of the conventional suction nozzle changing apparatus for a surface mounting apparatus is complicated. Namely, since the suction nozzle and the system have complicated construction, the fabrication processes of the system is complicated, for thus increasing the fabrication cost, whereby the reliability of the system is degraded.

SUMMARY OF THE INVENTION

Accordingly, it is an object of the present invention to provide a suction nozzle automatic changing apparatus for a conventional surface mounting apparatus which overcomes the problems encountered in the conventional art.

It is another object of the present invention to provide an improved suction nozzle automatic changing apparatus for a surface mounting apparatus which is capable of simplifying the construction of the system and enhancing the reliability thereof.

To achieve the above objects, in accordance with a first embodiment of the present invention, there is provided a suction nozzle automatic changing apparatus for a surface mounting apparatus which includes a first pneumatic cylinder having an upper position sensor for detecting a predetermined movement, an upwardly and downwardly movable station connected to a rod of the first pneumatic cylinder, a second pneumatic cylinder having an opening/closing sensor and a clamp sensor and engaged to one side of the station, a clamp having a guide groove and an engaging portion formed on the upper surface thereof, one side of which is connected to the rod of the second pneumatic cylinder, slidably covering the upper portion of the station, and reciprocating in accordance with the movement of the rod of the second pneumatic cylinder, a position determination member having a vertical nozzle receiving hole formed in the center portion thereof, and a clamp groove formed in an outer circumferential surface thereof, which position determination member is inserted into the guide groove of the clamp and is disposed on the upper surface of the station, a suction nozzle having a nozzle hole formed in the center portion thereof, a ring engaging portion formed in an outer circumferential surface thereof, and an engaging groove matching with the clamp groove when being inserted into the position determination member, a head section having an insertion hole formed in the center portion thereof, into which insertion hole the suction nozzle is inserted, and a ring insertion groove formed in a lower portion thereof, and a nozzle support ring engaged to the ring insertion groove of the head section.

To achieve the above objects, in accordance with a second embodiment of the present invention, there is provided a suction nozzle automatic changing apparatus for a surface mounting apparatus which includes a pneumatic cylinder mounted in a frame, a station base a portion of which is connected with a cylinder rod of the pneumatic cylinder, a pin station disposed on the station base having a plurality of vertical position determination pins, a slider slidably mounted on a guide groove formed on the station base, a plurality of clamps engaged to the slider for clamping the suction nozzle inserted on the position determination pin, a clamp shaft arranged in the slider and passing through the pin station and the station base, a clamp cylinder mounted on one side of the station base for driving the cylinder rod, a connection rod connected between the cylinder rod and the clamp shaft in order for the cylinder rod and the clamp shaft of the clamp cylinder to be moved together, and a nozzle shaft of a head section, arranged above the position determination pin for selectively separating the suction nozzle.

Additional advantages, objects and features of the invention will become more apparent from the description which follows.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIGS. 2A through 2H are views illustrating a suction nozzle automatic changing apparatus for a surface mounting apparatus according to a first embodiment of the present invention, of which:

FIG. 2A is a top view of the same;

FIG. 2B is an enlarged view of the area encircled by dashed lines in FIG. 2E;

FIG. 2C is an enlarged view of the area encircled by dashed lines in FIG. 2F;

FIGS. 2D and 2H are horizontal and vertical cross-sectional views of a position determination member;

FIG. 2E is a front view of the same;

FIG. 2F is a side view of the same; and

FIG. 2G is an enlarged view of the area encircled by dashed lines on FIG. 2A.

FIGS. 3A through 3D are views illustrating a head and a suction nozzle of a surface mounting apparatus according to a first embodiment of the present invention, of which:

FIG. 3A is a cross-sectional view illustrating an engaged state between the head section and the suction nozzle of the surface mounting apparatus; and FIG. 3B is a front view illustrating a suction nozzle of the surface mounting apparatus; and FIG. 3C is a cross-sectional detail view of the head; and FIG. 3D is a cross-sectional detail view of the nozzle;

FIG. 8 is a side view of FIG. 6;

DETAILED DESCRIPTION OF THE INVENTION

Figure 1A:
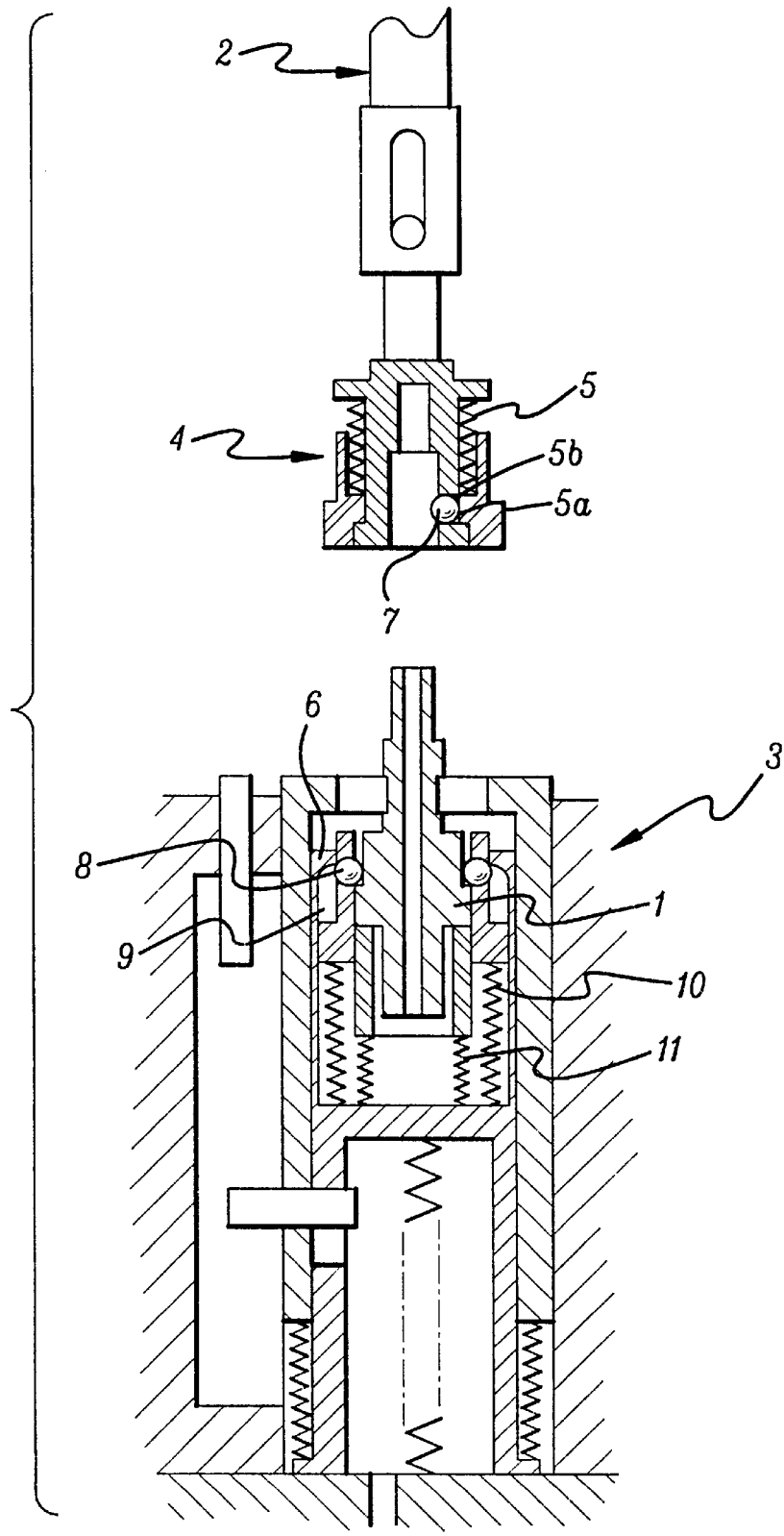
FIGS. 1A through 1E are cross-sectional views illustrating a suction nozzle changing apparatus for a conventional surface mounting apparatus.
Figure 1B:
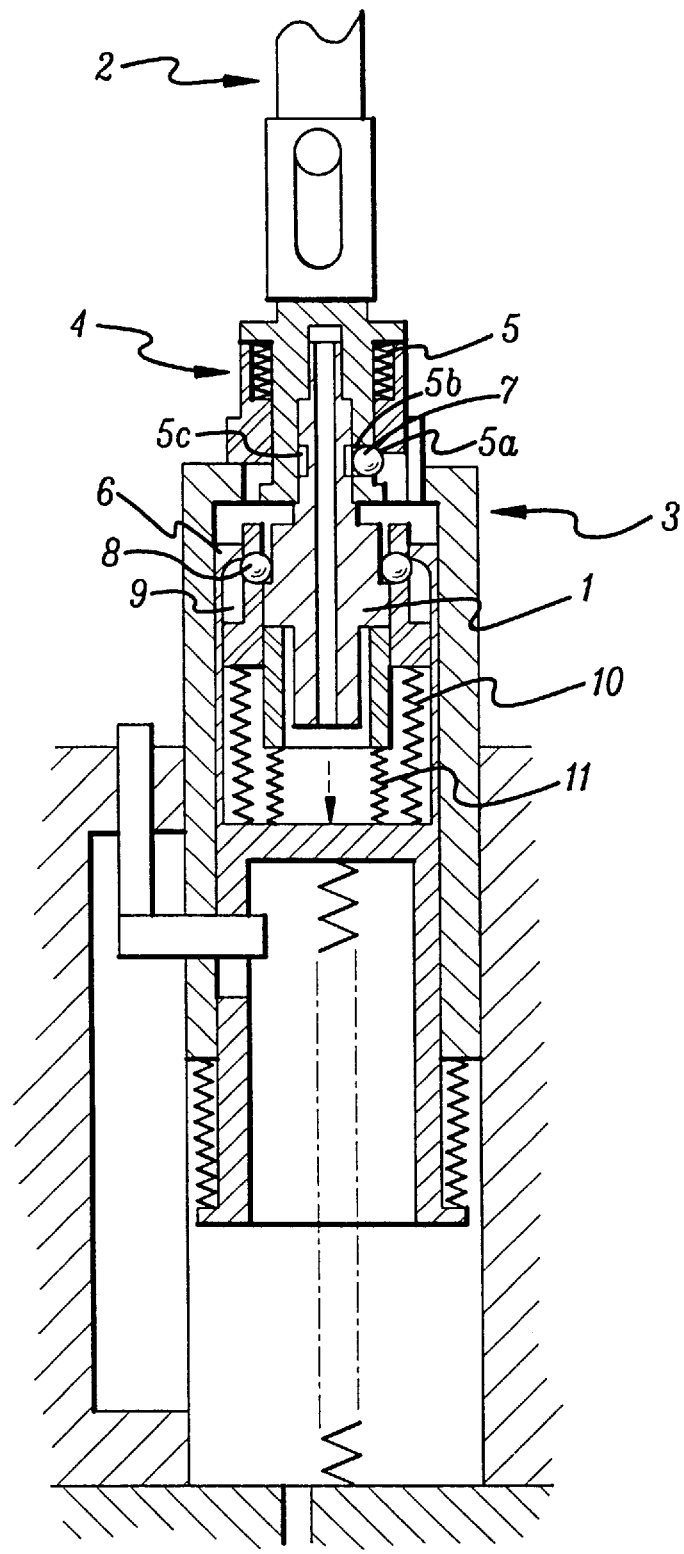
Figure 1C:
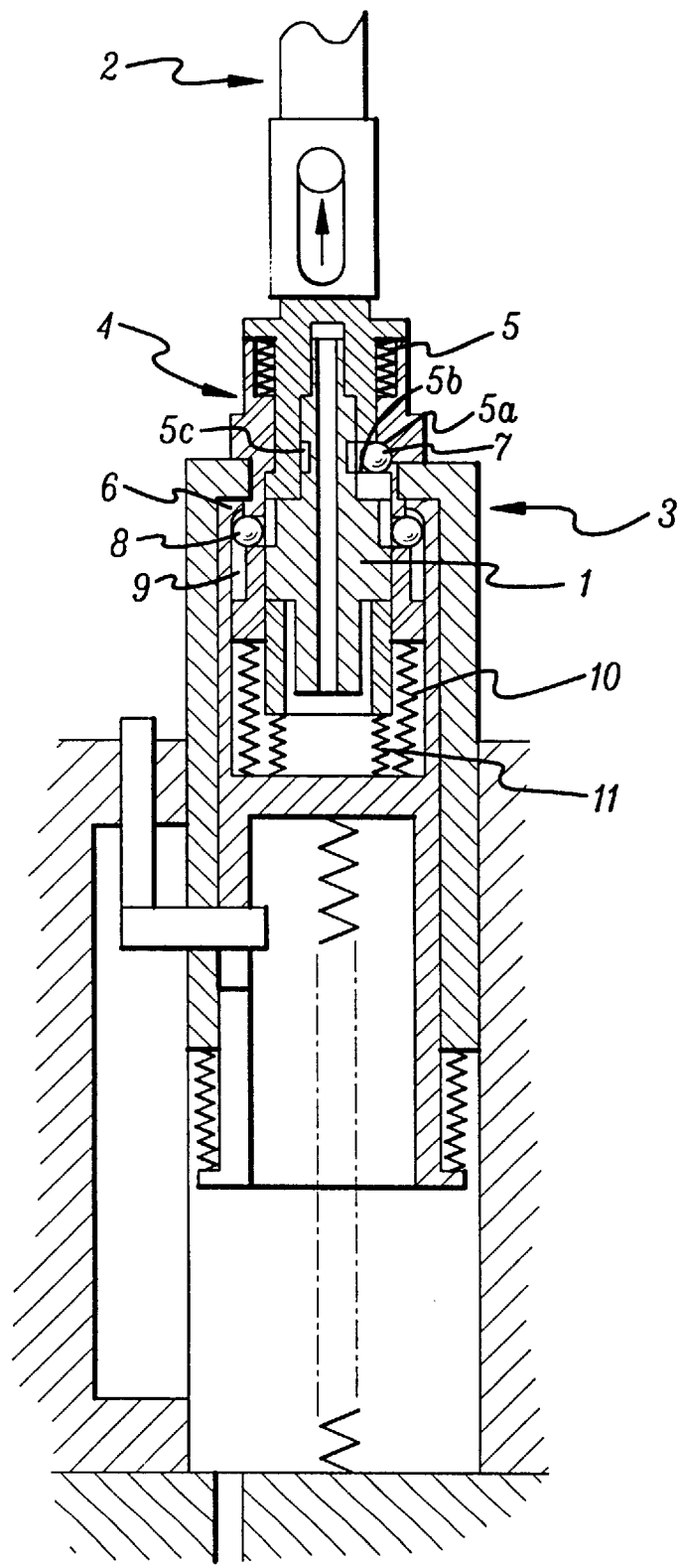
Figure 1D:
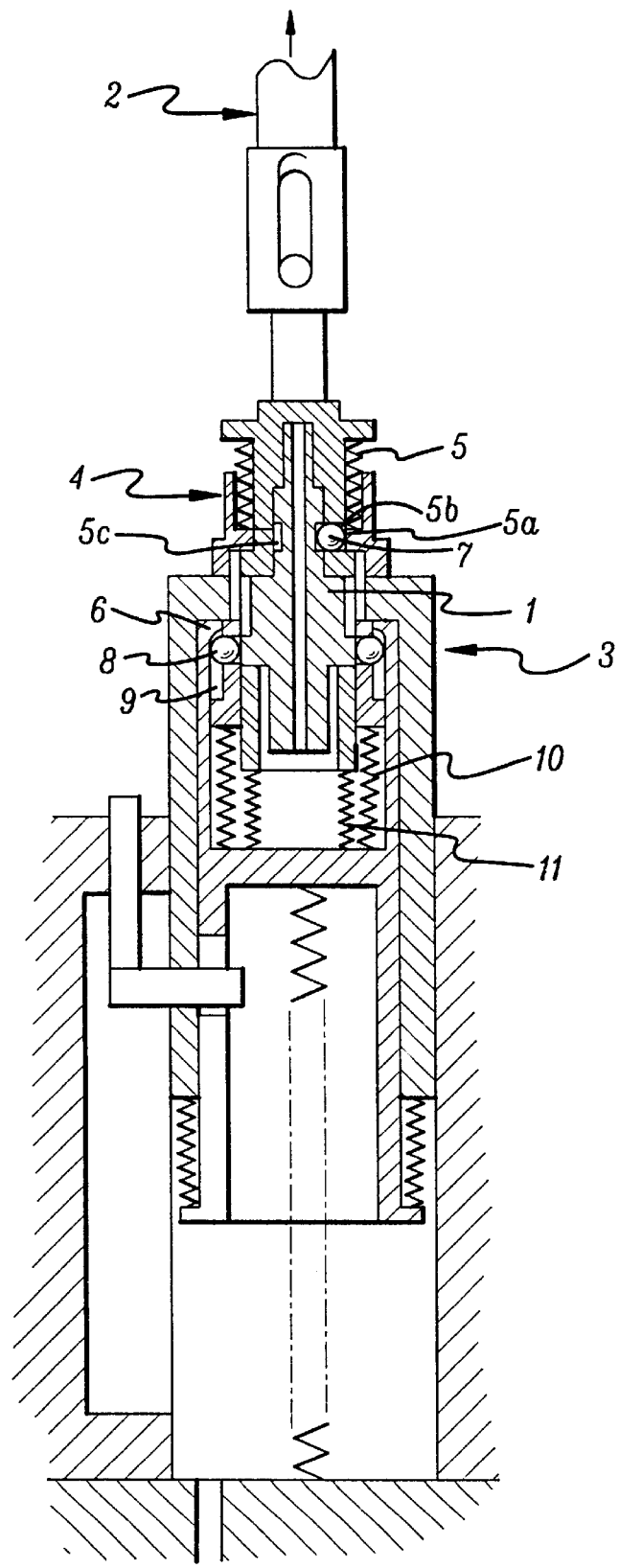
Figure 1E:
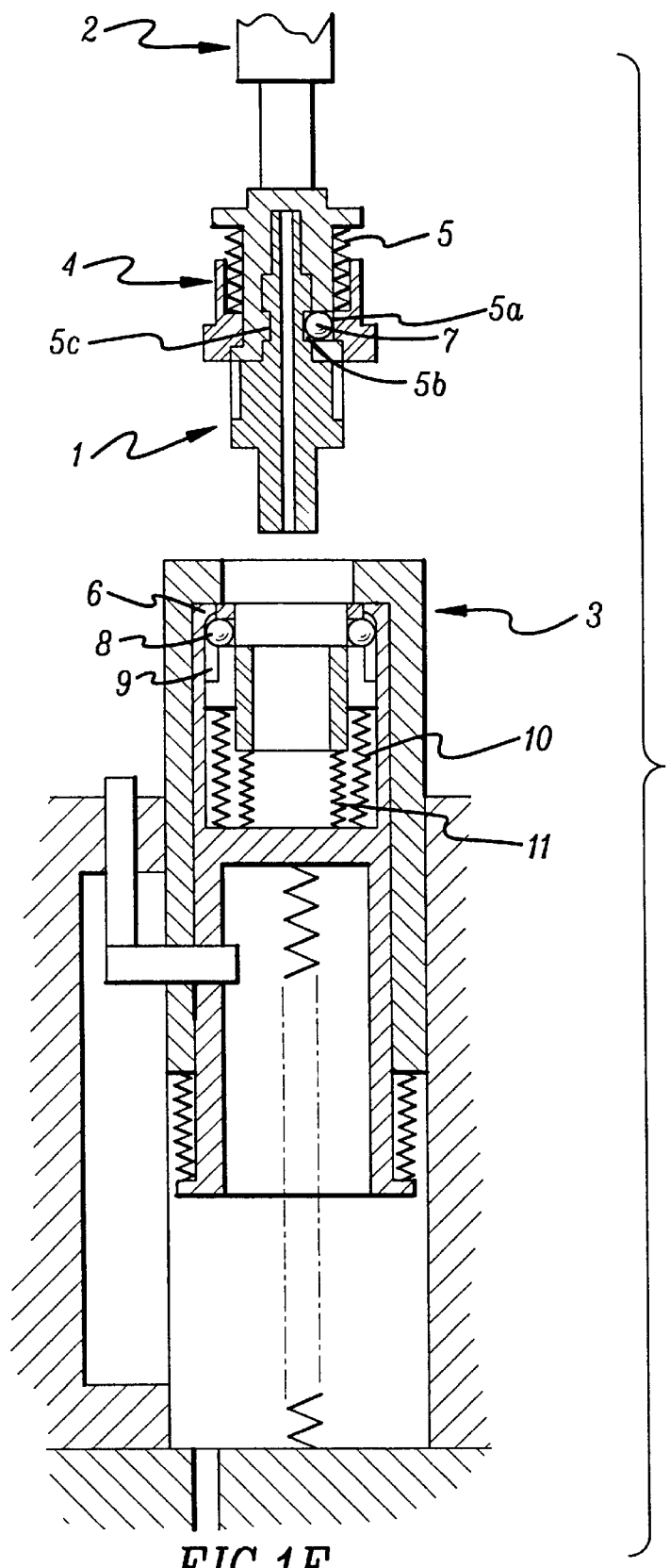
Figure 3A:
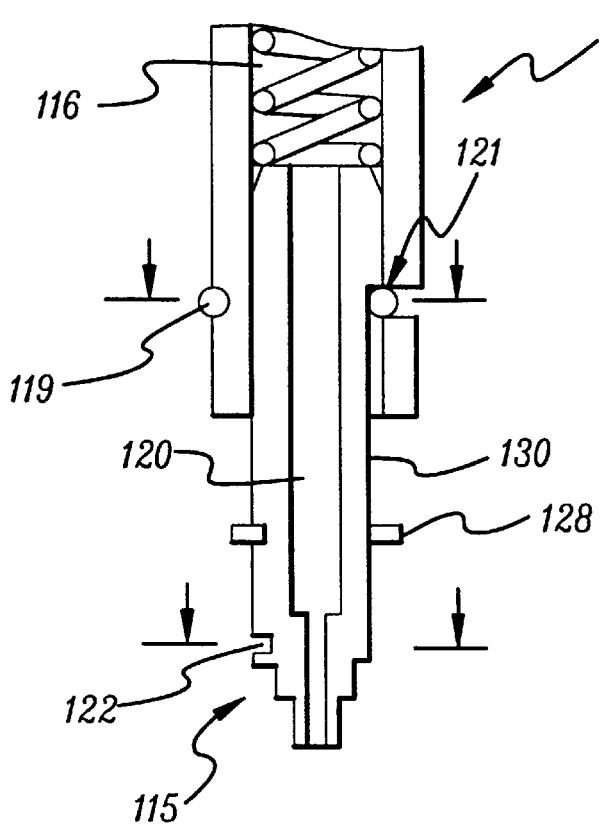
Figure 3C:
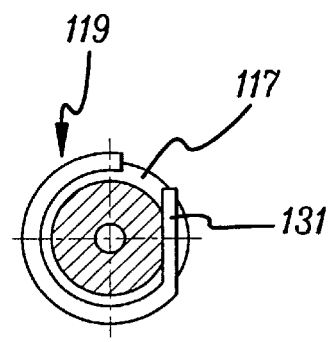
Figure 3D:
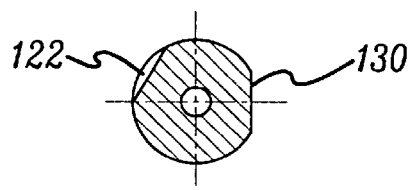
Figure 3B:
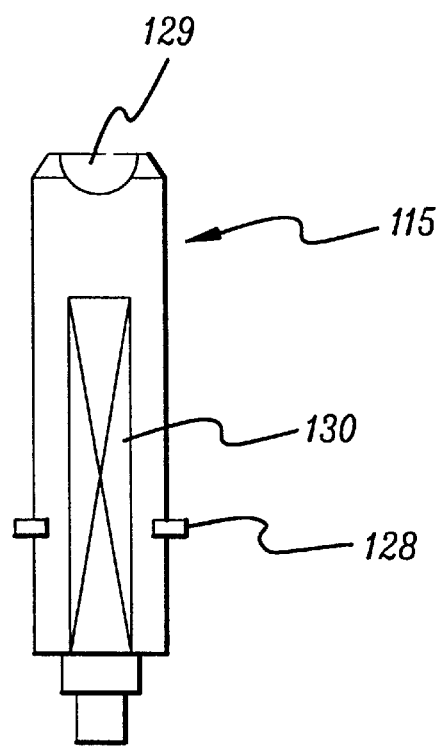

FIGS. 2A through 2H are views illustrating a suction nozzle automatic changing apparatus for a surface mounting apparatus according to a first embodiment of the present invention, of which FIG. 2A is a top view of the same, FIG. 2G being an enlarged view of the area encircled with dashed lines in FIG. 2A, FIG. 2E is a front view of the same, FIG. 2B being an enlarged view of the area encircled with dashed lines in FIG. 2E, FIG. 2F is a side view of the same, FIG. 2C being an enlarged view of the area encircled with dashed lines in FIG. 2F, and FIG. 2D and 2H are horizontal and vertical cross-sectional views of a position determination member. In addition, FIGS. 3A through 3D are views illustrating a head and a suction nozzle of a surface mounting apparatus according to a first embodiment of the present invention, of which FIG. 3A is a cross-sectional view illustrating an engaged state between the head section and the suction nozzle of the surface mounting apparatus, FIG. 3B is a front view illustrating a suction nozzle of the surface mounting apparatus, FIG. 3C is a cross-sectional detail view of the head, and FIG. 3D is a cross-sectional detail view of the nozzle.

As shown therein, the suction nozzle automatic changing apparatus for a surface mounting apparatus according to a first embodiment of the present invention includes a first pneumatic cylinder 101 having an upper position sensor 100 for detecting the movement of the rod 102, an upwardly and downwardly movable station 103 connected to a rod 102 of the first pneumatic cylinder 101, a second pneumatic cylinder 106 having an opening/closing sensor 104 and a clamp sensor 105 and connected to one side of the station 103, a clamp 110 having a guide groove 107 and an engaging portion 108, connected to the second pneumatic cylinder 106 through a connection portion 125 and a rod 109 and reciprocating in accordance with the movement of the rod 109 connected to the second pneumatic cylinder 106, and a position determination member 113 having a nozzle receiving hole 111 and a clamp groove 112 formed in the outer circumferential surface thereof, with the position determination member 113 being inserted into the guide groove 107 of the clamp 110. In addition, a support 114 is arranged in a lower portion of the surface mounting apparatus. With the above-described elements, a lower mechanism of the system is formed.

In addition, as a lower mechanism of the system, there are provided a head section 118, having an insertion hole 116 into which a suction nozzle 115 is inserted, a ring insertion groove 117 formed in an outer circumferential surface of the head section 118 and a nozzle support ring 119 inserted into the ring insertion groove 117 of the head section 118.

In addition, the suction nozzle 115 includes a nozzle hole 120 formed in the center portion thereof, a ring engaging portion 121 formed in the outer circumferential surface thereof, and an engaging groove 122 matching with the clamp groove 112 when the suction nozzle 115 is inserted into the position determination member 113.

The first pneumatic cylinder 101 may be formed of a twin rod reciprocating type pneumatic cylinder in which two rods 102 are arranged. The upper position sensor 100 detects the movement of the rod 102. In addition, the rod 102 connected to the first pneumatic cylinder 101 is vertically moved with respect to the moving direction of the rod 109 of the second pneumatic cylinder 106. Namely, the rod 102 of the first pneumatic cylinder 101 is vertically moved, and the rod 109 of the second pneumatic cylinder 106 is horizontally moved.

In addition, the station 103 includes a station base 123. An engaging hole 124 into which the position determination member 113 is inserted is formed on the upper surface of the station base 123. Preferably, eight engaging holes 124 are formed. In addition, the clamp 110 slidably covers the upper surface and both sides of the station base 123, and includes a connection portion 125 connected to the rod 109 connected to the second pneumatic cylinder 106. Preferably, two guide grooves 107 are formed on the upper surface of the station base 123. An enlarged portion 126 having a larger width than the guide groove 107 is formed in one side of the guide groove 107. Both sides of the enlarged portion 126 are formed to be inclined at a predetermined angle, for thus forming the engaging portion 108. Preferably, four enlarged portions 126 are formed at a regular interval with respect to each guide groove 107, and match with the engaging holes 124 when being engaged to the station base 123.

The position determination member 113 is inserted into the engaging hole 124 formed in the upper surface of the station base 123, with the engaging portion 108 being inserted into the clamp groove 112 when the clamp 110 slides, and a support portion 127 is formed in a portion of the position determination member 113, so that the support portion 127 is engaged to the upper surface of the clamp 110, for thus matching the engaging portion 108 and the clamp groove 112.

A position determination ring 128 is engaged to the outer circumferential surface of the suction nozzle 115, so that the engaging groove 122 of the suction nozzle 115 matches with the clamp groove 112 of the position determination member 113 when inserting the suction nozzle 115 into the position determination member 113, and a taper section 129 is formed at both sides of the top portion of the suction nozzle 115, for thus facilitating a smooth insertion with respect to the nozzle support ring 119. In addition, the engaging groove 122 formed in the suction nozzle 115 is formed to have an inclined portion to match with the inclined portion of the engaging portion 108 formed in the clamp 110. In addition, the ring engaging portion 121 is formed to have a cut-away portion, for thus forming a flat portion 130 on the outer circumferential surface of the suction nozzle 115.

The ring insertion groove 117 formed in a lower portion of the head section 118 is formed to have a predetermined depth, for thus communicating with the insertion hole 116. In addition, the nozzle support ring 119 engaged to the ring insertion groove 117 has a bent portion, and then is positioned in an inner portion of the insertion hole 116, and an engaging portion 131 is formed to be engaged to the ring engaging portion 121 of the suction nozzle 115 when inserting the suction nozzle 115 into the insertion hole 116.

The operation of the suction nozzle automatic changing apparatus for the surface mounting apparatus according to a first embodiment of the present invention will now be explained.

Figure 4D:
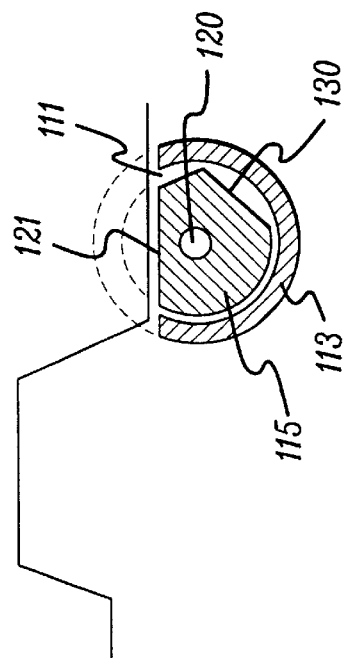
FIGS. 4A through 4F are views illustrating the process for separating a suction nozzle from the head section of the surface mounting apparatus according to a first embodiment of the present invention.
Figure 4E:
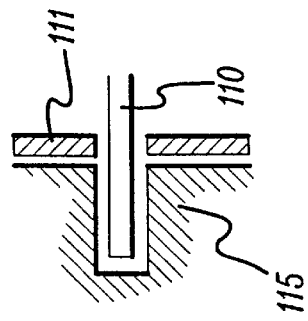
Figure 4A:
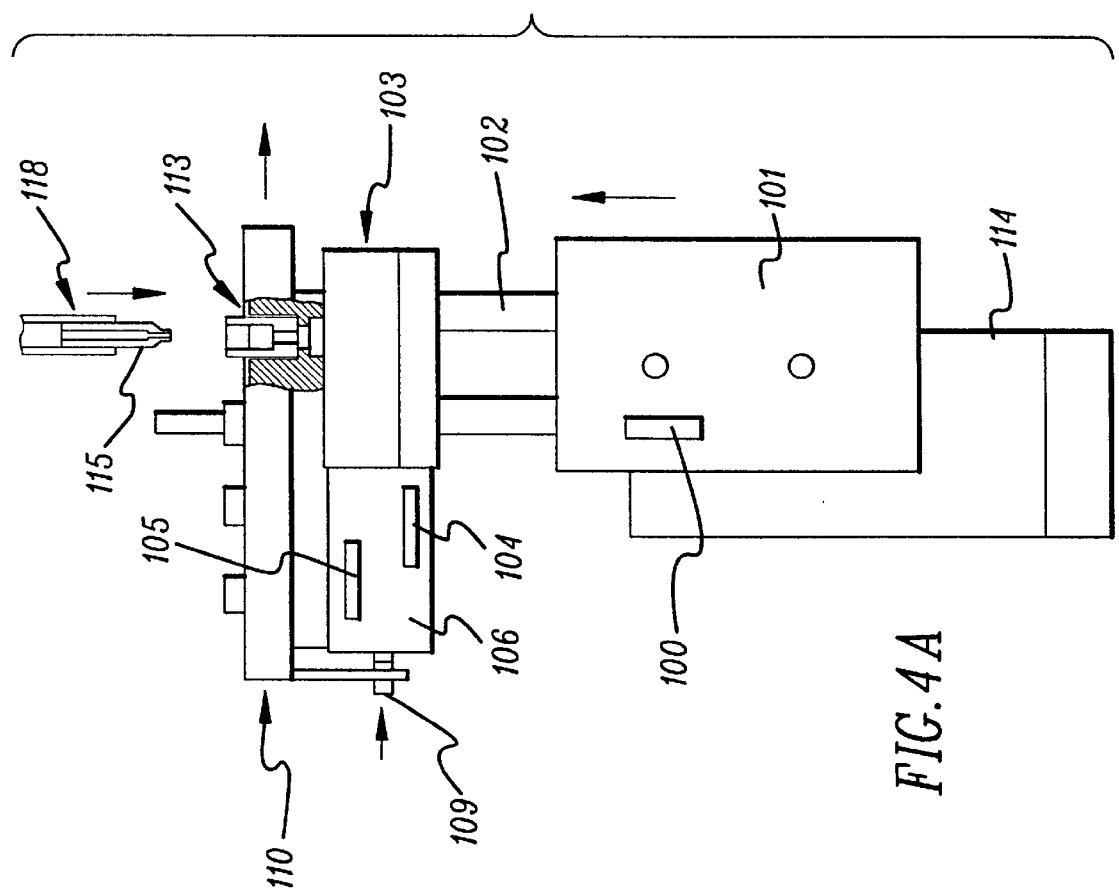

First, in the process of separating the suction nozzle 115 from the head section 118 of the surface mounting apparatus, as shown in FIGS. 4A through 4F, in a state that the head section 118 having the suction nozzle 115 is positioned above the position determination member 113, the station 103 is upwardly moved by the first pneumatic cylinder 101 as shown in FIG. 4A.

Next, the clamp 110 is horizontally moved by the second pneumatic cylinder 106, and then the enlarged portion 126 and the position determination member 113 are matched with each other, and the nozzle receiving hole 111 becomes an opened state. Here, the head section 118 is downwardly moved in cooperation with a detection operation by the opening/closing sensor 104, and the suction nozzle 115 is inserted into the nozzle receiving hole 111 of the position determination member 113. During the above-described process, the position determination ring 128 engaged to the suction nozzle 115 is placed above the position determination member 113, so that the clamp groove 112 and the engaging groove 122 are positioned at the same height.

Figure 4B:
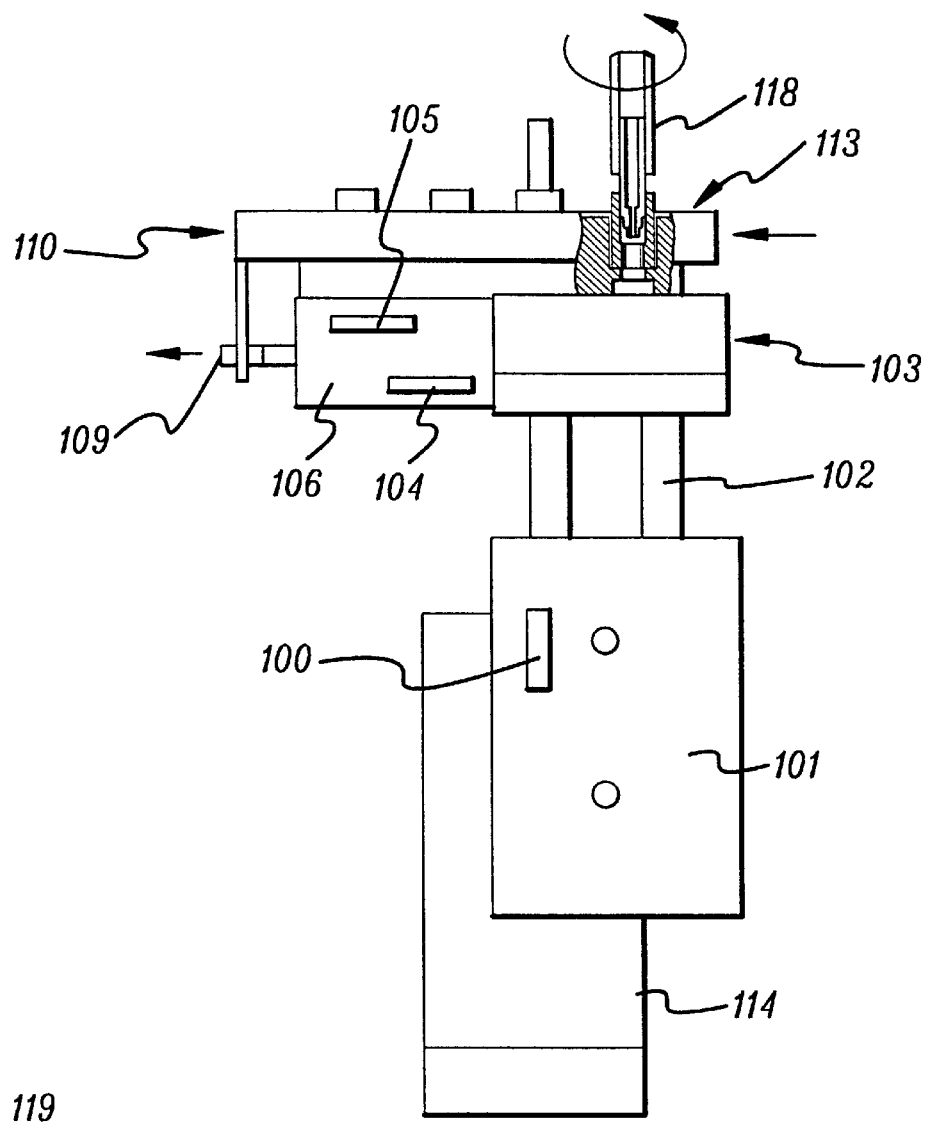
Figure 4F:
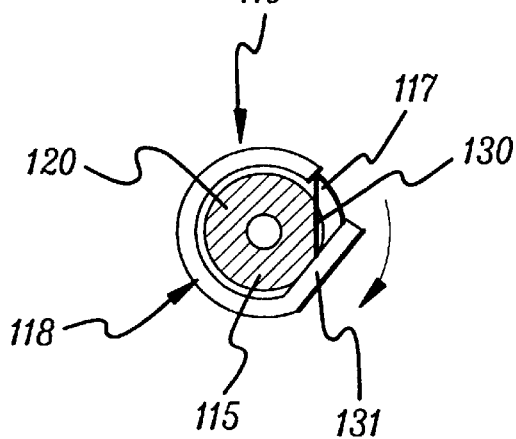
Figure 4C:
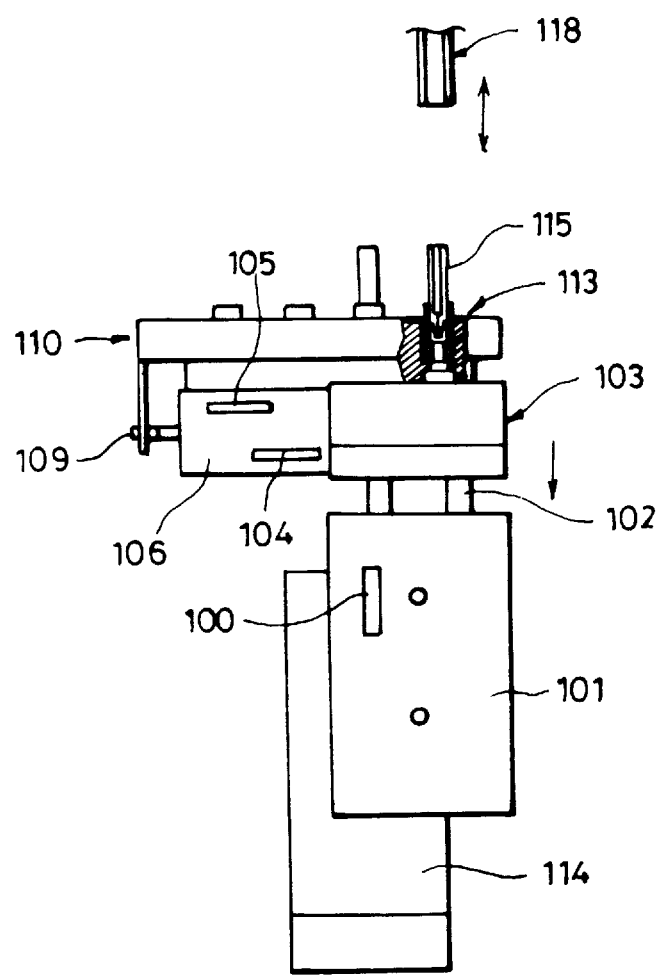

Next, the clamp 110 is horizontally moved by the second pneumatic cylinder 106, and the engaging portion 108 of the clamp 110 is inserted into the engaging groove 122 of the suction nozzle 115, for thus fixing the suction nozzle 115. Thereafter, the head section 118 is rotated by a predetermined angle in cooperation with the detection operation by the clamp sensor 105. In addition, as shown in FIG. 3A, the suction nozzle 115 is inserted into the insertion hole 116 of the head section 118, and the ring engaging portion 121 is matched with the engaging portion 131 of the nozzle support ring 119. In the above-described state, when the head section 118 is rotated, as shown in FIG. 4B, the nozzle support ring 119 is widened, and the engaging portion 131 is escaped from the ring engaging portion 121, and is positioned in the outer circumferential surface of the suction nozzle 115. In this state, the head section 118 is upwardly moved, and the suction nozzle 115 is separated from the head section 118.

When the suction nozzle 115 is completely separated therefrom, the head section 118 opens a vacuum valve (not shown), and forms vacuum therein, and then the vacuum is detected so as to judge whether the suction nozzle 115 is separated.

Figure 5A:
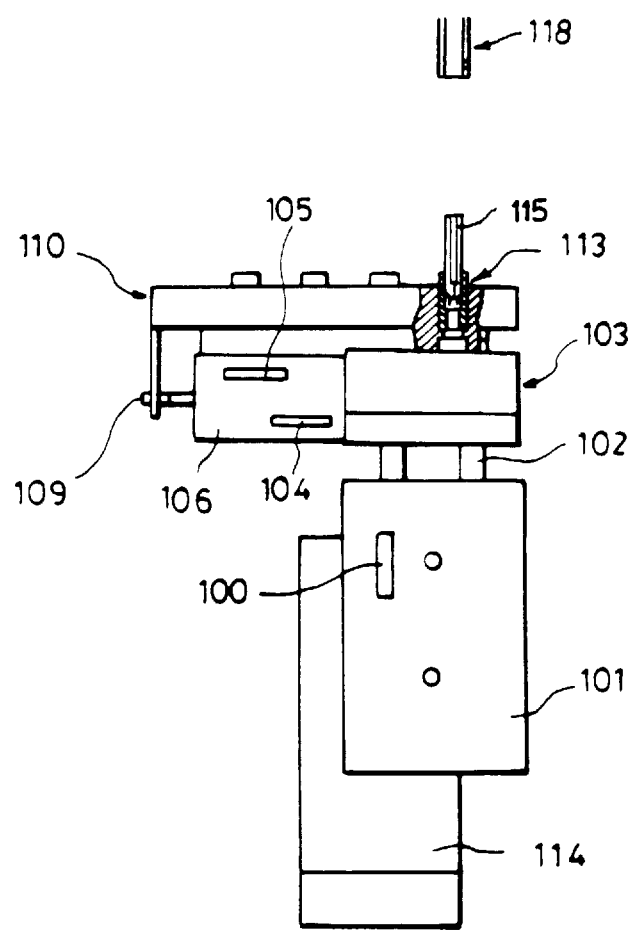
FIGS. 5A through 5C are views illustrating the process for engaging the suction nozzle to the head of the surface mounting apparatus according to a first embodiment of the present invention.
Figure 5B:
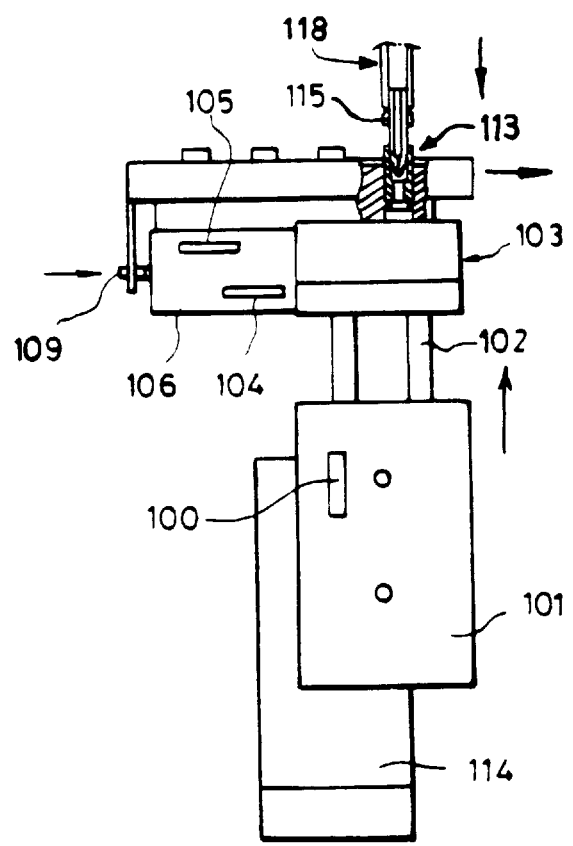

On the contrary, the process of engaging the suction nozzle 115 to the head section 118 will now be described. As shown in FIGS. 5A through SC, in a state that the head section 118 is positioned above the position determination member 113 having the suction nozzle 115, the head section 118 is moved downwardly, and then is inserted onto the suction nozzle 115. Here, the nozzle support ring 119 is easily widened by the taper sections 129 formed on the top portion of the suction nozzle 115, and the ring engaging portion 121 of the suction nozzle 115 is engaged to the engaging portion 131 of the nozzle support ring 119.

Figure 5C:
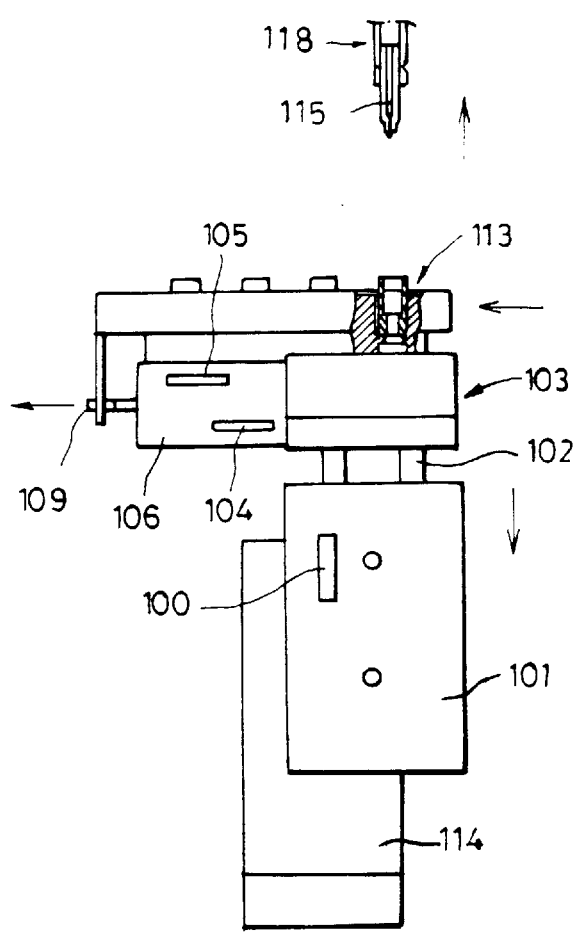
Figure 6:
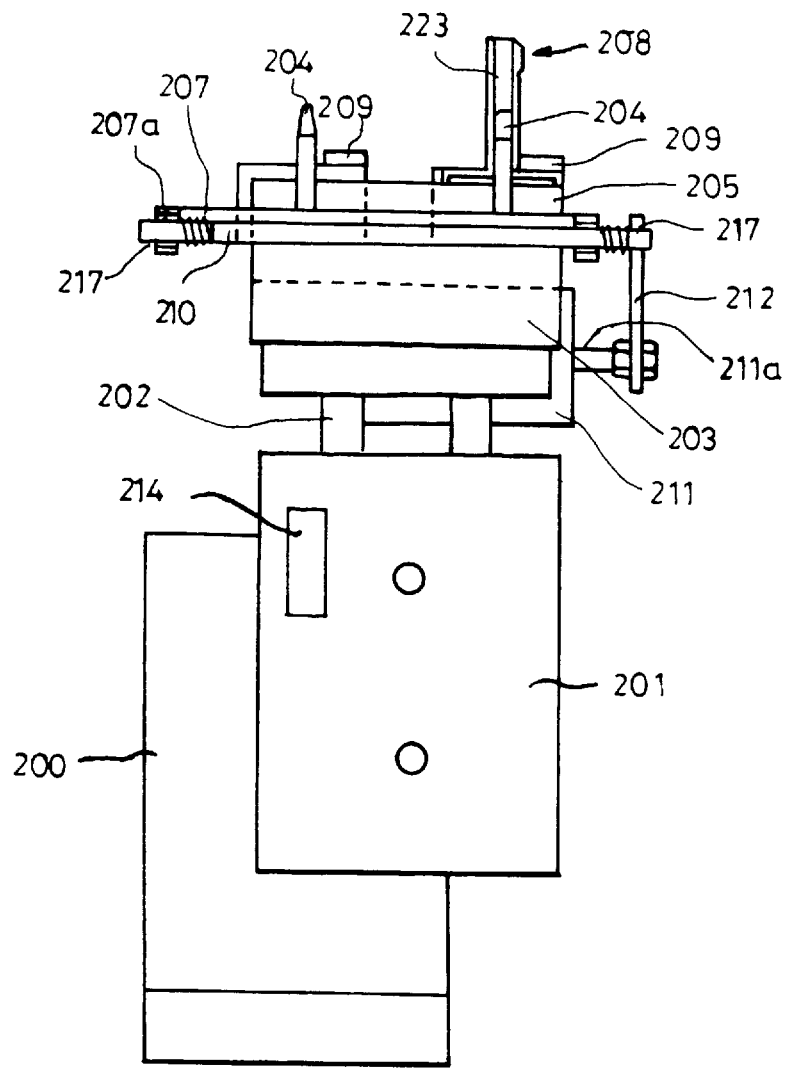
FIG. 6 is a front view illustrating the construction of a suction nozzle changing apparatus for a surface mounting apparatus according to a second embodiment of the present invention.
Figure 7:
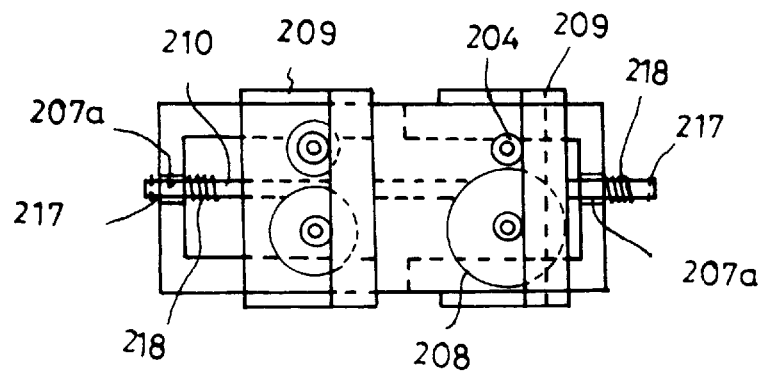
FIG. 7 is a top view of FIG. 6.
Figure 9A:
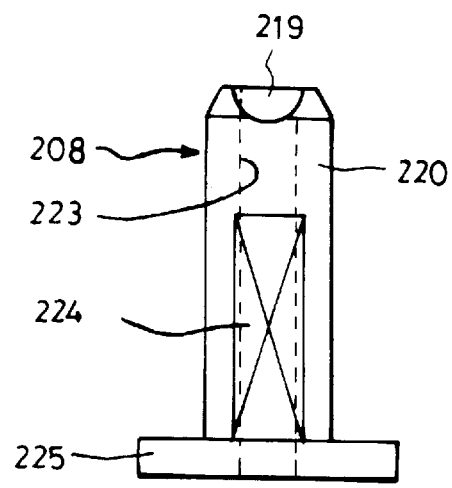
FIGS. 9A and 9B are front and side views illustrating a suction nozzle of a surface mounting apparatus according to a second embodiment of the present invention.
Figure 9B:
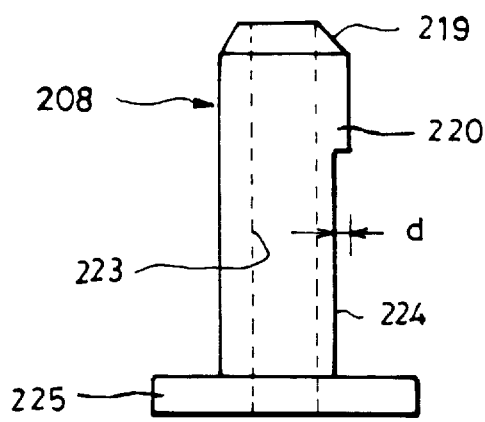

Next, when the clamp 110 is horizontally moved by the second pneumatic cylinder 106, the engaging portion 108 is escaped from the engaging groove 122 by the movement of the clamp 110, and becomes open state. The suction nozzle 115 is simply inserted into the nozzle receiving hole ill of the position determination member 113. Thereafter, as shown in FIG. 5C, the head section 118 is upwardly moved, and then the suction nozzle 115 is separated from the position determination member 113. Next, the clamp 110 is horizontally moved by the second pneumatic cylinder 106, and the clamp sensor 105 is operated. Thereafter, the station 103 is downwardly moved by the first pneumatic cylinder 101, so that the process is completed.

In addition, after the suction nozzle 115 clamps the head section 118, the head section opens the vacuum valve (not shown), and forms a vacuum state, and the vacuum level is measured so as to judge whether the suction nozzle 115 is clamped thereto.

Next, the suction nozzle automatic changing apparatus for a surface mounting apparatus according to a second embodiment of the present invention will now be explained with reference to FIGS. 6 through 11B.

First, a pneumatic cylinder 201 is engaged to a frame 200. A pin station 205 having a plurality of position determination pins 204 is arranged above a station base 203 connected with a cylinder rod 202 connected to the pneumatic cylinder 201. A horizontally movable slider 207 is arranged in a guide groove 206 (shown in FIG. 8) formed between the pin station 205 and the station base 203, and clamps 209 are engaged to the slider 207 for clamping a suction nozzle 208 inserted onto a position determination pin 204.

Here, a clamp shaft 210 passes through the pin station 205 and the station base 203.

In addition, a clamp cylinder 211 is engaged to a portion of the station base 203 for driving the cylinder rod 211a, and a connection rod 212 is disposed between the cylinder rod 211a of the clamp cylinder 211 and the clamp shaft 210 to move together with the cylinder rod 211a and the clamp shaft 210.

In addition, a nozzle shaft 213 of a head section (not shown) is disposed above the position determination pin 204 of the pin station 205 so as to separate the suction nozzle 208.

Here, a position detection sensor 214 is attached to the outer surface of the pneumatic cylinder 201 for detecting the position of the station base 203 when the pneumatic cylinder 201 is operated.

In addition, a clamp on sensor 215 and a clamp off sensor 216 are attached to a portion of the clamp cylinder 211 for detecting an on/off state of the clamp cylinder 211 and for transferring a control signal to a controller (not shown) for releasing or maintaining a clamping state of the clamp 209 with respect to the suction nozzle 208.

E-rings 217 are disposed at both ends of the clamp shaft 210 for preventing escaping of the clamp shaft 210 from a through hole 207a of the slider 207, and clamping springs 218 are disposed at both ends of the clamp shaft 210 for providing the clamp shaft 210 with an elastic force.

Figure 13:
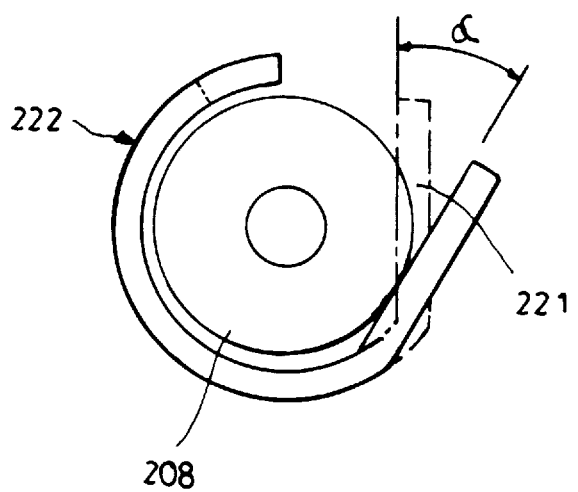
FIG. 13 is a horizontal cross-sectional view taken along line XIII–XIII' of FIG. 12F.

In addition, a support spring 222 (shown in FIG. 13) having an elastic portion 221 (shown in FIG. 13) is disposed in a portion of the nozzle shaft 213 so that the support spring 222 elastically moves along the inclined portion of the suction nozzle 208, and is engaged to an engaging portion 220 in order for the suction nozzle to be clamped by the nozzle shaft 213, for thus clamping the suction nozzle 208.

In the drawings, reference numeral 224 denotes a flat portion, 223 denotes a vacuum hole, and 225 denotes a suction plate.

The operation of the suction nozzle automatic changing apparatus for a surface mounting apparatus according to a second embodiment of the present invention will now be explained with reference to FIGS. 10A through 13.

Figure 10A:
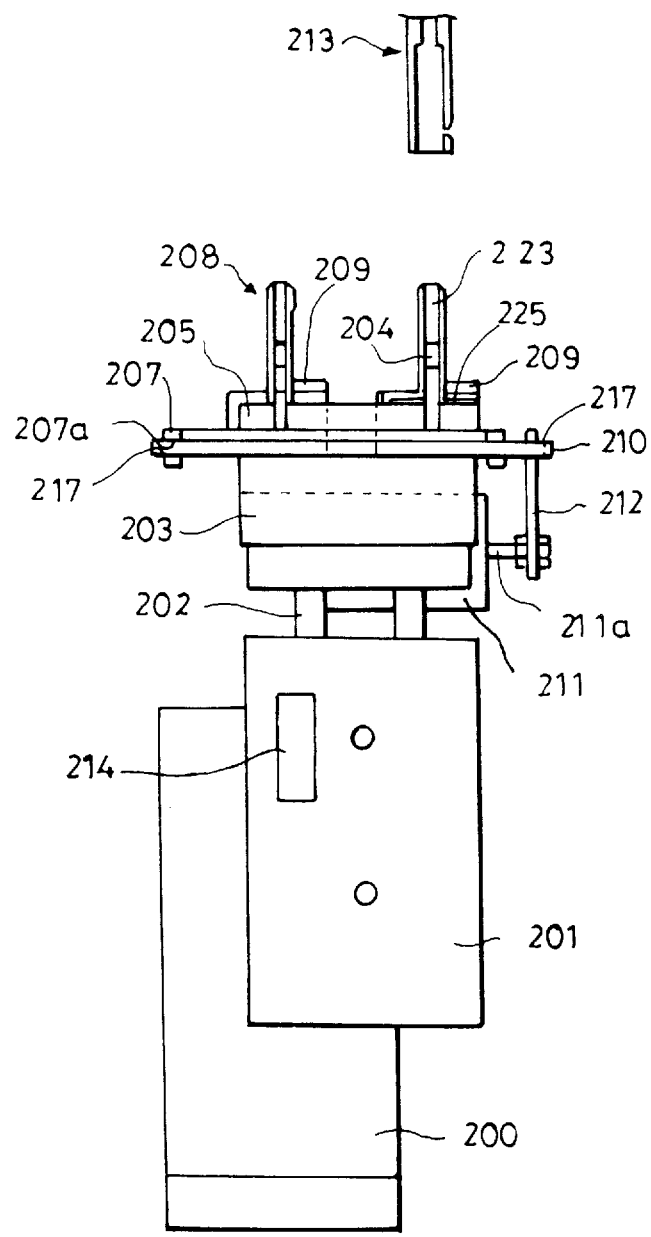
FIGS. 10A through 10E are cross-sectional views illustrating the process for separating a suction nozzle from the head section of the suction nozzle automatic changing apparatus of the surface mounting apparatus according to a second embodiment of the present invention.
Figure 10B:
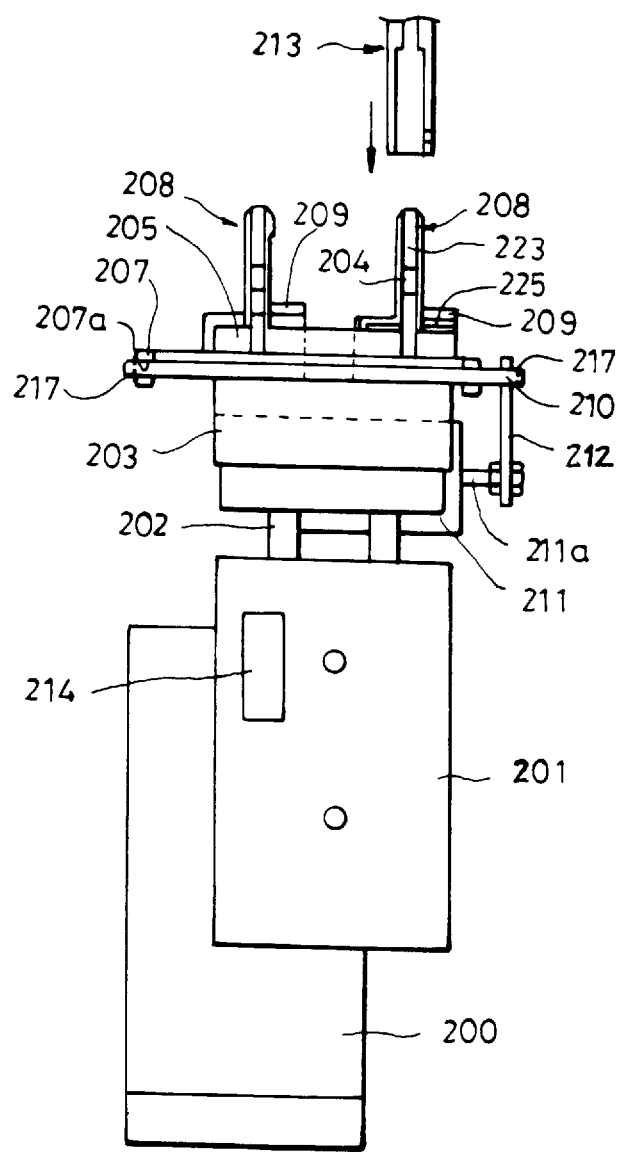

First, in a state that the suction nozzle 208 is inserted onto the position determination pin 204 of the pin station 205, when the suction nozzle 208 is intended to be separated from the position determination pin 204 to the head section (not shown), the nozzle shaft 213 is downwardly moved toward the to portion of the suction nozzle 208 as shown in FIGS. 10A and FIG. 10B.

Figure 10C:
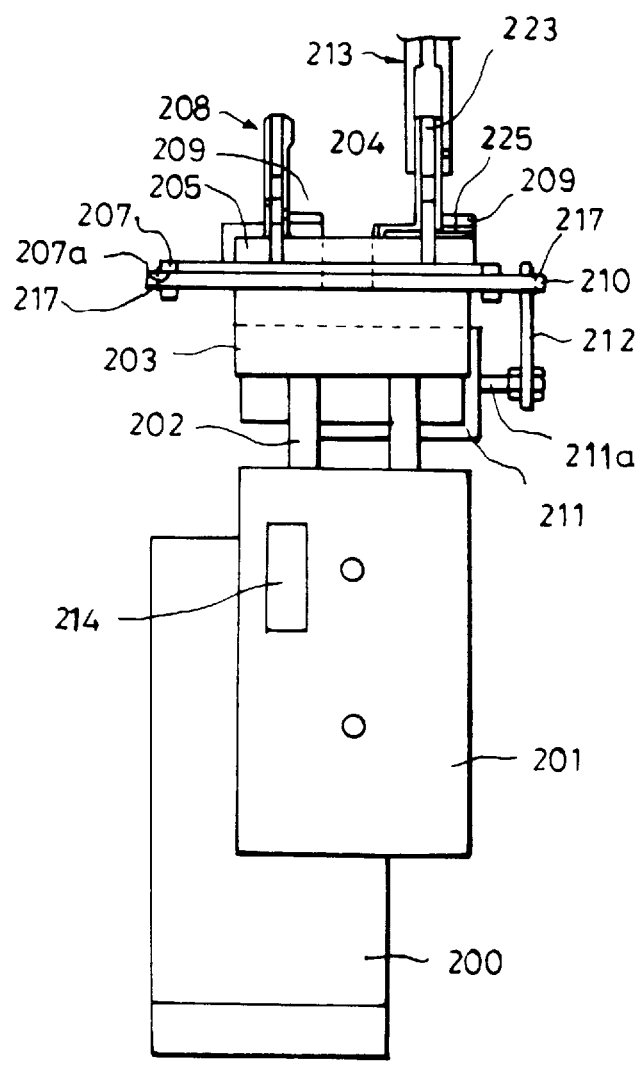

As the pneumatic cylinder 201 engaged to the frame 200 is operated, and the cylinder rod 202 is upwardly moved, the suction nozzle, as shown in FIG. 10C, is inserted into the vacuum hole 223 of the nozzle shaft 213.

Here, since the position detection sensor 214 is disposed in the outer surface of the pneumatic cylinder 201 for detecting the upward movement of the station base 203, and the upward movement of the station base 203 is detected thereby. In addition, the position detection sensor 214 outputs a control signal to the controller (not shown) to stop the station base 203 at a predetermined height.

In addition, since the clamp support spring 222 of the suction nozzle 208 is disposed in the nozzle shaft 213, the elastic portion 221 of the support spring (not shown) of the nozzle shaft 213 contacts with the inclined surface 219 of the suction nozzle 208, and is outwardly moved thereby when the nozzle shaft 213 is downwardly moved, and the pin station 205 is upwardly moved. After the nozzle shaft 213 is downwardly moved, and the pin station 205 is upwardly moved, the elastic portion 221 is returned to the original position, and is engaged to a lower portion of the engaging portion 220 of the suction nozzle 208, so that the clamping between the nozzle shaft 213 and the suction nozzle 208 is made.

Namely, since the flat portion 224 is formed in a lower portion of the suction nozzle 208, the elastic portion 221 formed in the support spring 222 (shown in FIG. 13) of the suction nozzle 208 is returned to the original shape, so that the clamping between the nozzle shaft 213 and the suction nozzle 208 is made.

In addition, as the nozzle shaft 213 and the suction nozzle 208 are engaged with each other, the clamp cylinder 211 is operated in accordance with the control by the controller (not shown).

Figure 10D:
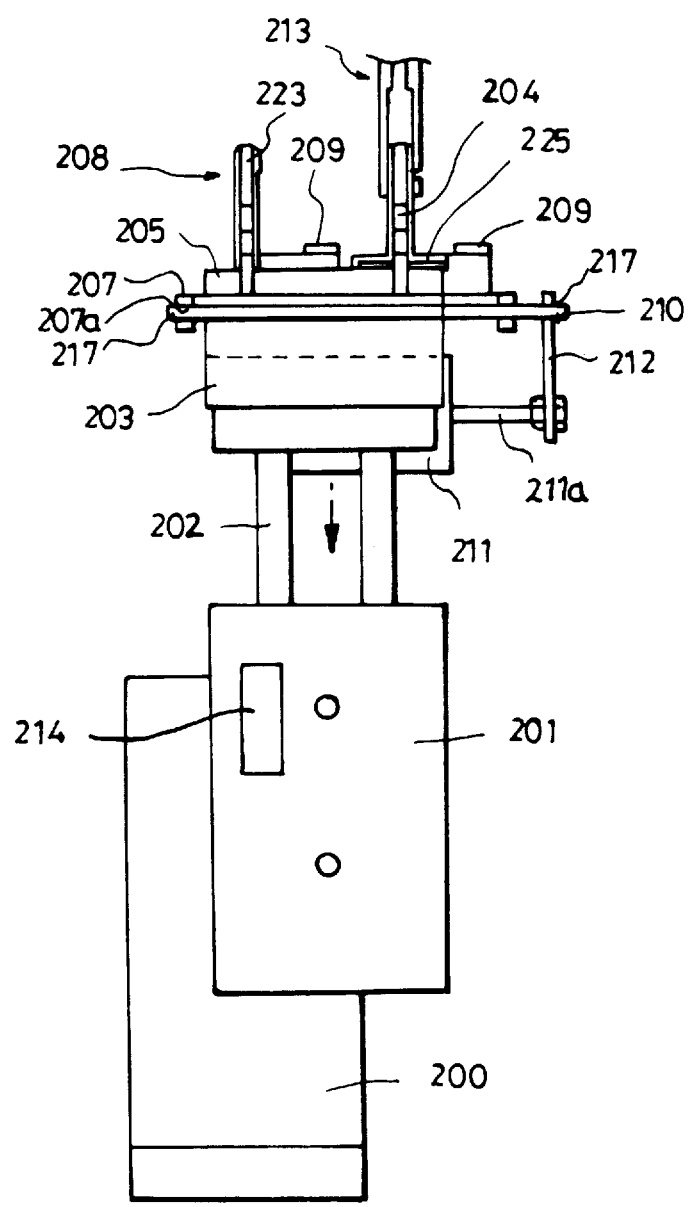
Figure 10E:
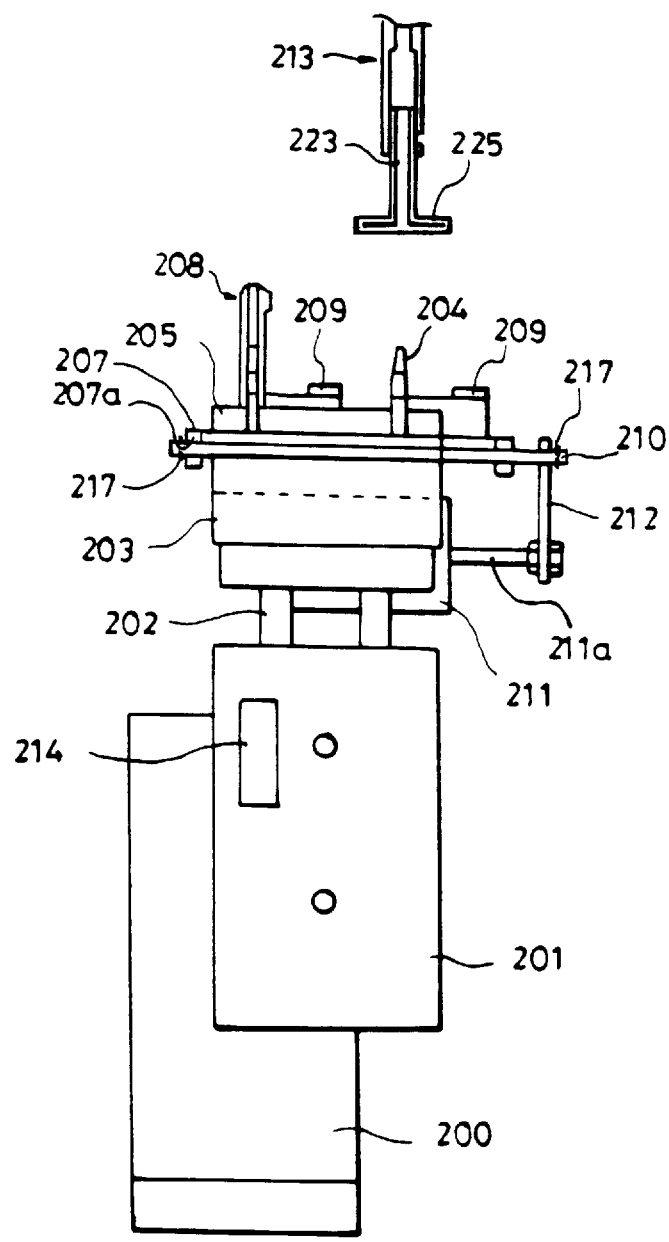
Figure 11A:
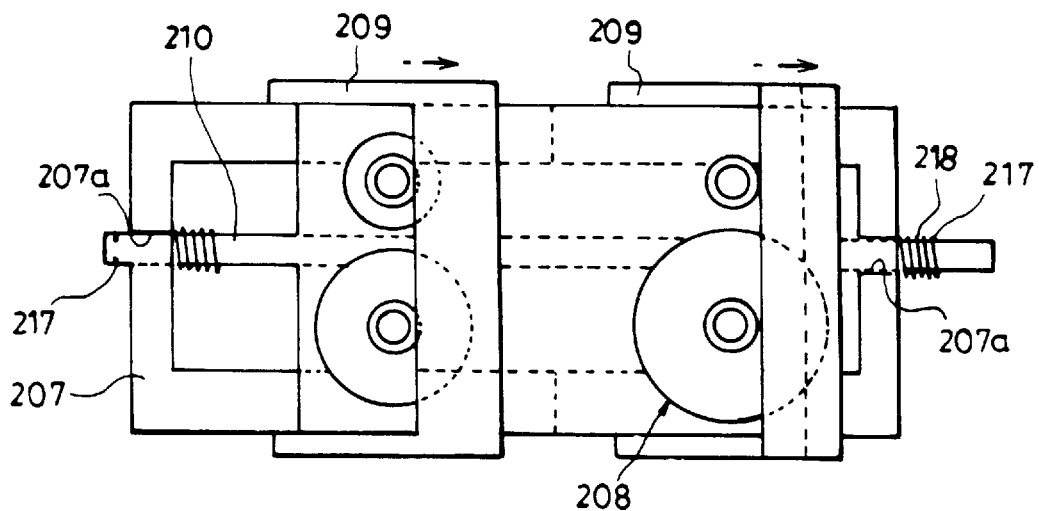
FIGS. 11A and 11B are top views illustrating the operations of FIGS. 10A and 10D.
Figure 11B:
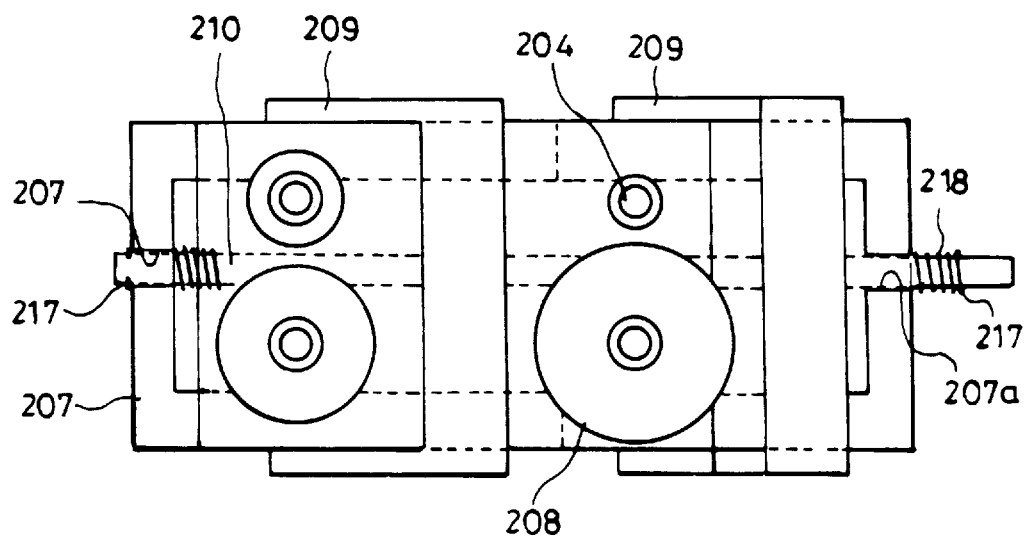

Therefore, when the cylinder rod 211a of the clamp cylinder 211 is moved toward the right side as shown in FIG. 10D, the clamp shaft 210 connected with the cylinder rod 211a by the connection rod 212, the slider 207 engaged to the clamp shaft 210, and the clamp 209 engaged to the slider 207 move toward the right side as shown in the drawings.

Here, since the E-rings 217 are engaged to both ends of the clamp shaft 210, it is possible to prevent escaping of the clamp shaft 210 from the through hole 207a of the slider 207, and it is possible to provide an elastic force to the clamp shaft 210.

Figure 12A:
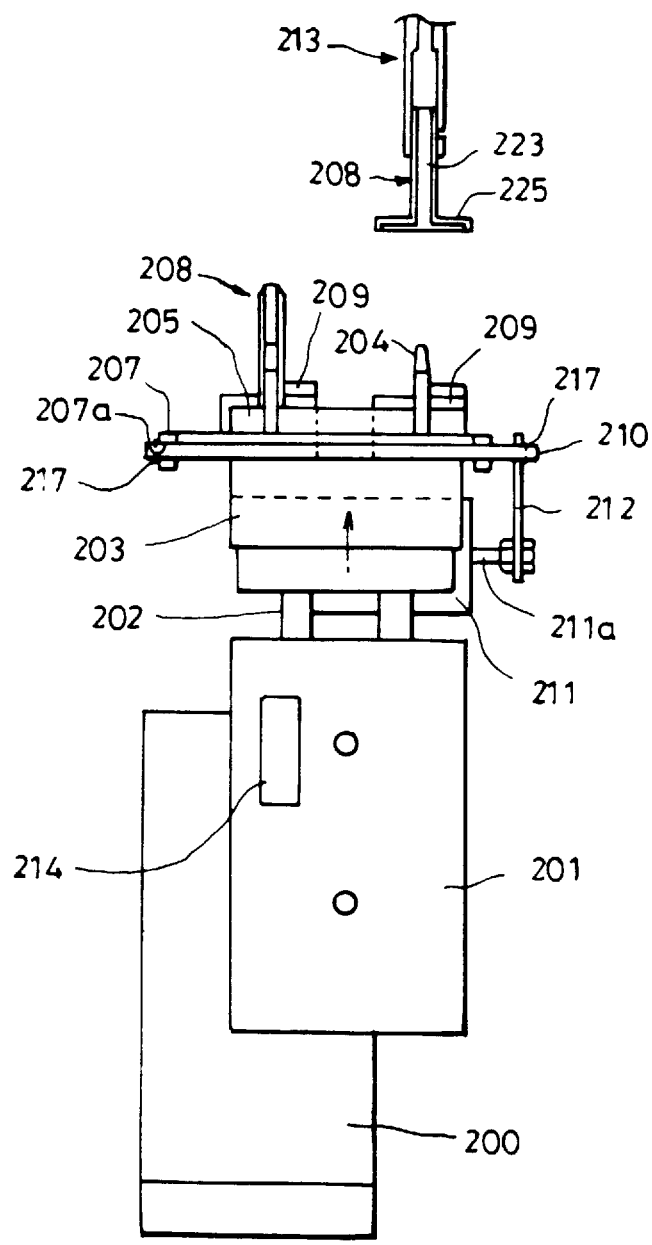
FIGS. 12A through 12G are cross-sectional views illustrating the process for engaging the suction nozzle to the head section of the surface mounting apparatus according to a second embodiment of the present invention.
Figure 12B:
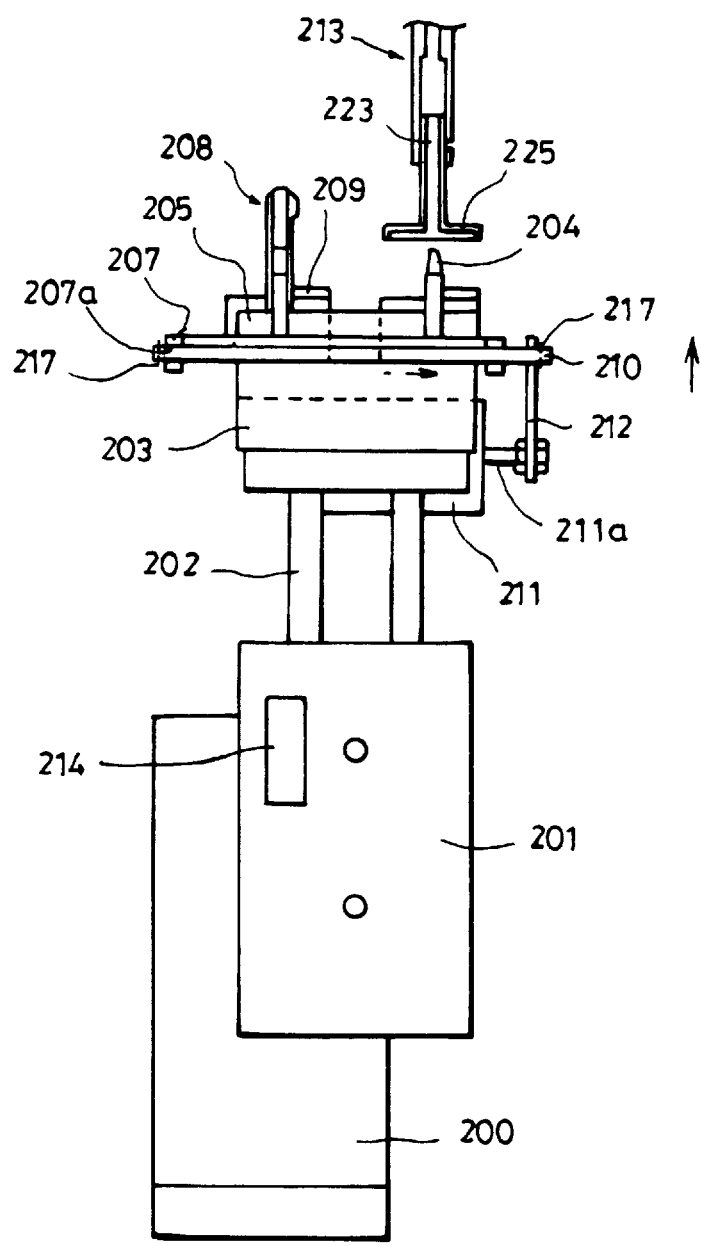

In addition, when separating the suction nozzle 208 clamped to the nozzle shaft 213 of the head section to the pin station 205, the head section having the suction nozzle 208 as shown in FIG. 12A is positioned above the position determination pin 204 of the pin station 205, and the pneumatic cylinder 201 disposed in the frame 200 is operated.

Thereafter, as the cylinder rod 202 of the pneumatic cylinder 201 is upwardly moved, the position detection sensor 214 attached to the outer surface of the pneumatic cylinder 201 detects the upward movement of the station base 203, and outputs a control signal to the controller (not shown) to stop the operation of the pneumatic cylinder 201.

Figure 12C:
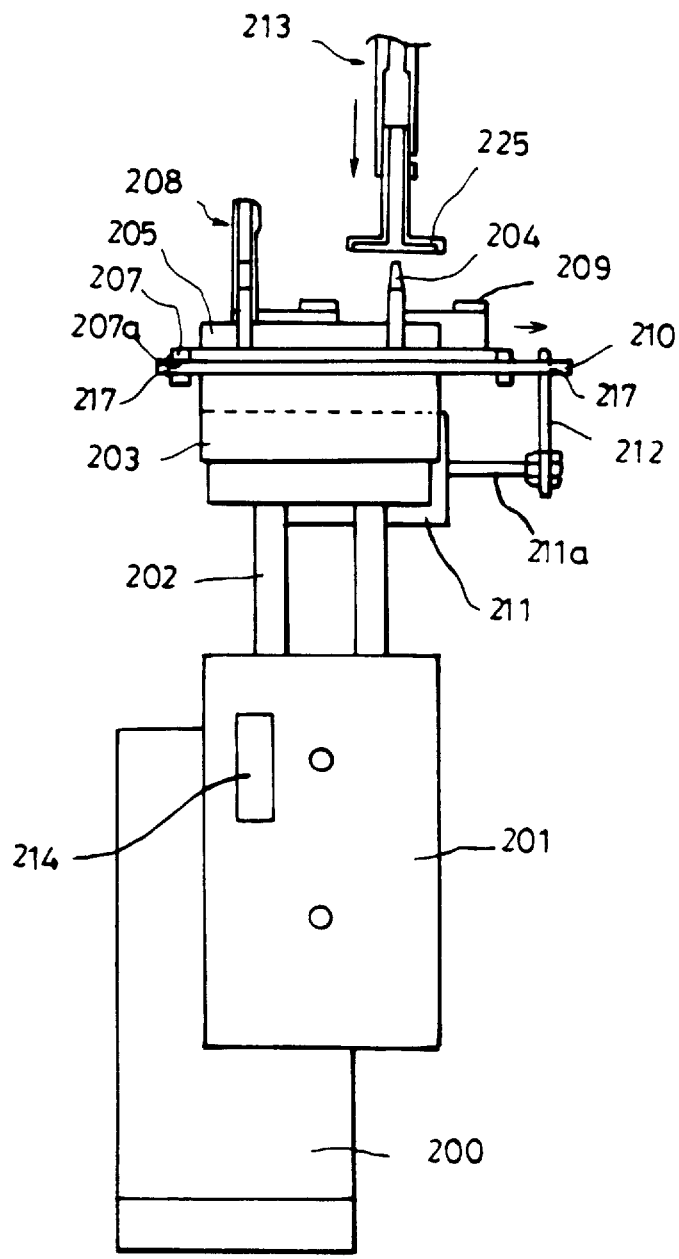
Figure 12D:
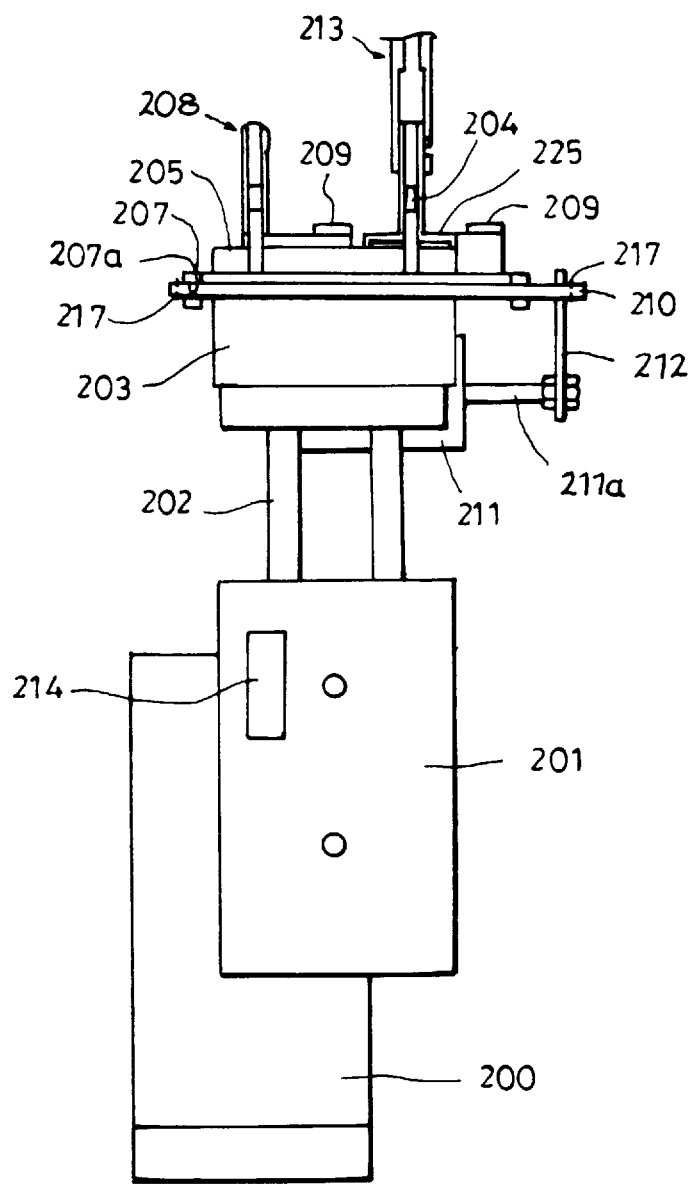

When the clamp cylinder 211 is operated by the controller, the cylinder rod 211a of the clamp cylinder 211 is moved toward the right side as indicated by the arrow in FIG. 12C, for thus obtaining a space for receiving the suction nozzle 208 therein.

Namely, when the cylinder rod 211a of the clamp cylinder 211 is moved, the clamp shaft 210 connected with the cylinder rod 211a by the connection rod 212, the slider 207 engaged with the clamp shaft 210, and the clamp 209 engaged with the clamp shaft 210 are moved, so that the clamp 209 uncovers the mounting surface of the suction nozzle 208.

Therefore, as the nozzle shaft 213, having the suction nozzle 208, of the head section is downwardly moved, the position determination pin 204 of the pin station 205 is inserted into the vacuum hole 223 of the suction nozzle 208.

Figure 12E:
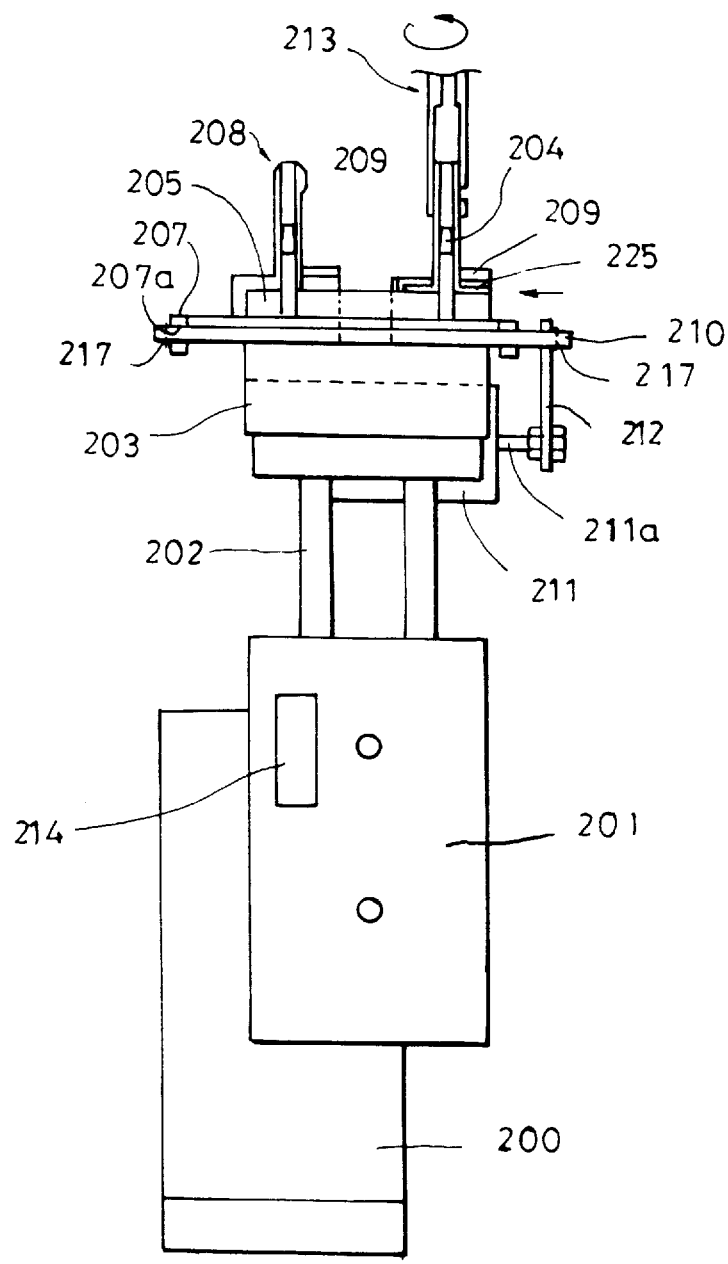
Figure 12F:
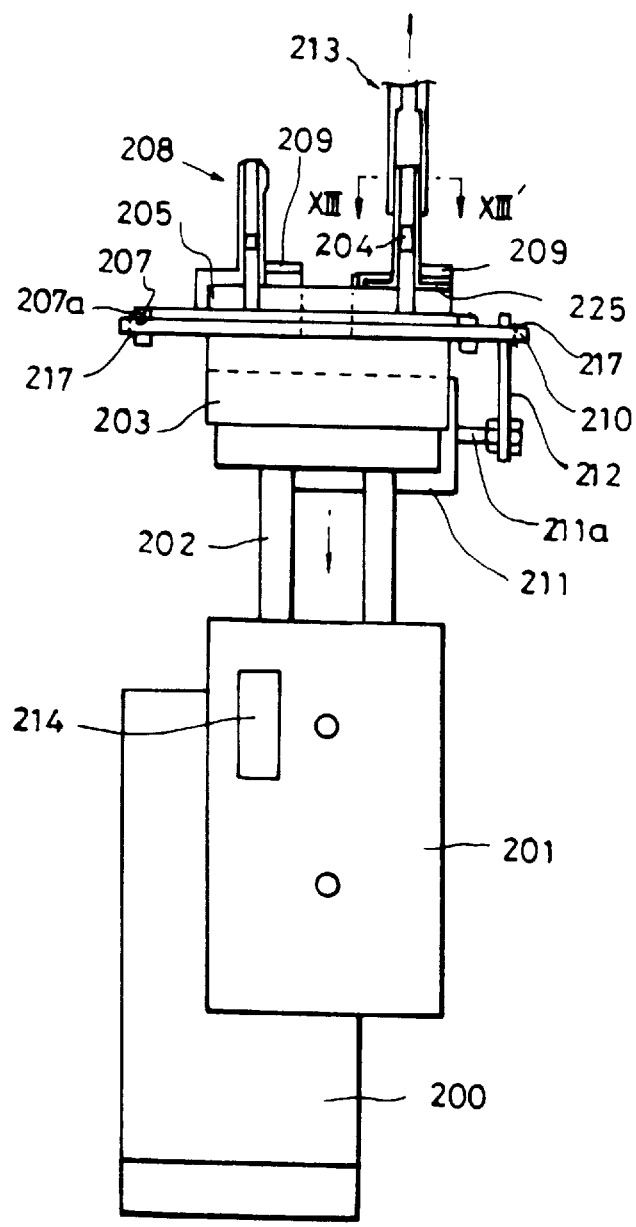
Figure 12G:
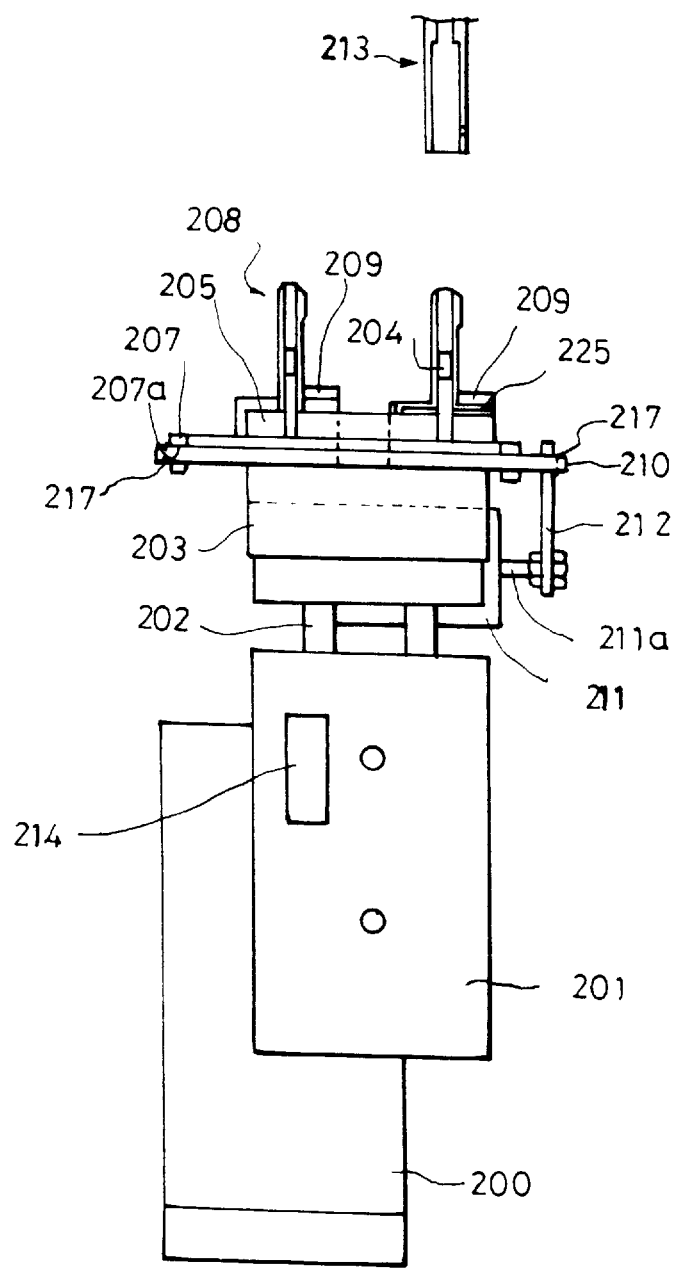

Thereafter, when the clamp on sensor 215 is turned on, and then the clamp cylinder 211 is operated, the clamp 209 is moved toward the left side as shown in FIG. 12E by the movement of the cylinder rod 211a and the clamp shaft 210.

In a state that the suction nozzle 208 is inserted onto the pin station 205, the clamp 209 is returned to the original position, and clamps the upper surface of the suction plate 225 of the suction nozzle 208 as shown in FIG. 12E, and the nozzle shaft 213 is rotated by a predetermined angle.

The elastic portion 221 of the support spring 222 of the suction nozzle 208 of the nozzle shaft 213 receives an elastic force, and is outwardly moved, so that the elastic portion 221 is escaped from the flat portion 224 of the suction nozzle 208.

Namely, when the nozzle shaft 213 is upwardly moved, since the elastic portion 221 of the support spring 222 of the suction nozzle 208 is not engaged with the engaging portion of the suction nozzle 208, it is possible to separate the suction nozzle 208 from the nozzle shaft 213.

In addition, since the rotation angle "α" of the nozzle shaft 213 for escaping from the engaging portion 220 is proportional to the depth "d" measured from the outer surface of the flat portion 224 of the suction nozzle 208, it is possible to control the rotation angle of the nozzle shaft 213 by adjusting the depth. Therefore, since the holding force generated by the overcoming force of the elastic portion 221 of the support spring 222 disposed in the outer surface of the suction nozzle 208 is neglectably small compared to the clamping force with respect to the suction nozzle 208 of the clamp 209, when the nozzle shaft 213 is upwardly moved, and the pin station 205 is downwardly moved by the pneumatic cylinder 201, the suction nozzle 208 is still inserted onto the position determination pin 204 of the pin station 205.

Therefore, with the above-described construction and operation, it is possible to more rapidly change the suction nozzle in cooperation with the position detection sensor 214 provided for detecting the upward movement of the station base 203, and the clamp on/off sensors 215 and 216 provided for outputting a control signal to the controller so that the clamping state of the clamp 209 with respect to the suction nozzle 208 is maintained or released.

As described above, the suction nozzle automatic changing apparatus for a surface mounting apparatus according to the present invention is basically directed to accurately clamping the suction nozzle 208 in cooperation with the pin station 205 and the clamp 209 based on the driving force by the pneumatic cylinder 201 and the clamp cylinder 211, and clamping the suction nozzle in cooperation with the elastic force by the spring, whereby it is possible to enhance the reliability of the system compared to the conventional suction nozzle changing apparatus for a surface mounting apparatus.

In addition, since the construction of the suction nozzle changing system is simpler compared to the conventional apparatus, it is possible to enhance the durability of the system, and increase the productivity.

Furthermore, since the fabrication processes of the present invention is simpler, it is possible to enhance the reliability of the system, for thus reducing the fabrication cost.

Although the preferred embodiments of the present invention have been disclosed for illustrative purposes, those skilled in the art will appreciate that various modifications, additions and substitutions are possible, without departing from the scope and spirit of the invention as recited in the accompanying claims.

What is claimed is:

1. A suction nozzle automatic changing apparatus for a surface mounting apparatus, comprising:

a first pneumatic cylinder having an upper position sensor for detecting a predetermined movement;

an upwardly and downwardly movable station connected to a rod of the first pneumatic cylinder;

a second pneumatic cylinder having an opening/closing sensor and a clamp sensor and engaged to one side of the station;

a clamp having a guide groove and an engaging portion formed on the upper surface thereof, one side of which is connected to the rod of the second pneumatic cylinder, slidably covering the upper portion of the station, and reciprocating in accordance with the movement of the rod of the second pneumatic cylinder;

a position determination member having a vertical nozzle receiving hole formed in the center portion thereof, and a clamp groove formed in an outer circumferential surface thereof, which position determination member is inserted into the guide groove of the clamp and is disposed on the upper surface of the station;

a suction nozzle having a nozzle hole formed in the center portion thereof, a ring engaging portion formed in an outer circumferential surface thereof, and an engaging groove matching with the clamp groove when being inserted into the position determination member;

a head section having an insertion hole formed in the center portion thereof, into which insertion hole the suction nozzle is inserted, and a ring insertion groove formed in a lower portion thereof; and a nozzle support ring engaged to the ring insertion groove of the head section.

2. The apparatus of claim 1, wherein a position determination ring is engaged to the suction nozzle so as to match the engaging groove of the suction nozzle with the clamp groove of the position determination member when the suction nozzle is inserted onto the position determination member.

3. A suction nozzle automatic changing apparatus for a surface mounting apparatus, comprising:

a pneumatic cylinder mounted in a frame;

a station base a portion of which is connected with a cylinder rod of the pneumatic cylinder;

a pin station disposed on the station base having a plurality of vertical position determination pins;

a slider slidably mounted on a guide groove formed on the station base;

a plurality of clamps engaged to the slider for clamping the suction nozzle inserted on the position determination pin;

a clamp shaft arranged in the slider and passing through the pin station and the station base;

a clamp cylinder mounted on one side of the station base for driving the cylinder rod;

a connection rod connected between the cylinder rod and the clamp shaft in order for the cylinder rod and the clamp shaft of the clamp cylinder to be moved together; and a nozzle shaft of a head section, arranged above the position determination pin for selectively separating the suction nozzle.

4. The apparatus of claim 3, wherein a plurality of E-rings are disposed at both ends of the clamp shaft for preventing the clamp shaft from being escaped from a though hole of the slider, and a plurality of clamping springs are disposed in the slider for providing a predetermined elastic force to the clamp shaft when the E-rings and the clamp shaft are operated.

* * * * *